(12) United States Patent
Takei

(10) Patent No.: US 7,355,263 B2
(45) Date of Patent: Apr. 8, 2008

(54) SEMICONDUCTOR DEVICE AND MANUFACTURING METHOD THEREOF

(75) Inventor: Manabu Takei, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 0 days.

(21) Appl. No.: 11/763,115

(22) Filed: Jun. 14, 2007

(65) Prior Publication Data

US 2007/0235755 A1  Oct. 11, 2007

Related U.S. Application Data

(62) Division of application No. 11/219,308, filed on Sep. 2, 2005, now Pat. No. 7,262,478.

(30) Foreign Application Priority Data

Sep. 2, 2004 (JP) ............................ 2004-256251
Jan. 27, 2005 (JP) ............................ 2005-020334

(51) Int. Cl.
     *H01L 29/00* (2006.01)
(52) U.S. Cl. .................... 257/526; 257/335; 257/557; 257/563
(58) Field of Classification Search ................ 257/526, 257/335, 557, 563
     See application file for complete search history.

(56) References Cited

U.S. PATENT DOCUMENTS 6,472,722 B1  10/2002  Ho (Continued)

FOREIGN PATENT DOCUMENTS

JP  8-316479 A  11/1996

(Continued)

OTHER PUBLICATIONS

Udrea, F. et al.; "A unified analytical model for the carrier dynamics in Trench Insulated Gate Bipolar Transistors (TIGBT)", Proceedings of 1995 International Symposium on Power Semiconductor Devices & IC's, Yokohama; pp. 190-195.

(Continued)

*Primary Examiner*—Douglas M. Menz
(74) *Attorney, Agent, or Firm*—Rossi, Kimms & McDowell, LLP

(57) ABSTRACT

A semiconductor device and method of manufacturing the same includes an $n^-$-single crystal silicon substrate, with an oxide film selectively formed thereon. On the oxide film, gate polysilicon is formed. The surface of the gate polysilicon is covered with a gate oxide film whose surface is covered with a cathode film doped in an n-type with an impurity concentration higher than that of the substrate as an $n^-$-drift layer. In the cathode film, a section in contact with the substrate becomes an $n^+$-buffer region with a high impurity concentration, next to which a p-base region is formed. Next to the p-base region, an $n^+$-source region is formed. On the cathode film, an interlayer insulator film is selectively formed on which an emitter electrode is formed. A semiconductor device such as an IGBT is obtained with a high rate of acceptable products, an excellent on-voltage to turn-off loss tradeoff and an excellent on-voltage to breakdown voltage tradeoff.

11 Claims, 28 Drawing Sheets

U.S. PATENT DOCUMENTS

| | | |
|---|---|---|
| 6,482,681 B1 | 11/2002 | Francis et al. |
| 6,610,572 B1 | 8/2003 | Takei et al. |
| 6,737,705 B2 | 5/2004 | Momota et al. |
| 6,833,562 B2 | 12/2004 | Tanimoto et al. |
| 7,037,788 B2 | 5/2006 | Ito et al. |
| 7,098,488 B2 | 8/2006 | Yoshikawa et al. |
| 2006/0076583 A1 | 4/2006 | Wakimoto et al. |

FOREIGN PATENT DOCUMENTS

| | | |
|---|---|---|
| JP | 2002-158356 A | 5/2002 |
| JP | 2002-208701 A | 7/2002 |
| JP | 2003-347549 A | 12/2003 |
| WO | 00/35021 A1 | 6/2000 |

OTHER PUBLICATIONS

Omura, I. et al.; "Carrier injection enhancement effect of high voltage MOS devices-Device physics and design concept"; IEEE, 1997; pp. 217-220.

Specification and drawings of related co-pending U.S. Appl. No. 11/754,751, filed May 29, 2007; "Semiconductor Device and Manufacturing Method Thereof"; Wakimoto et al.; 45 pgs.

Related co-pending U.S. Appl. No. 11/780,624; filed on Jul. 20, 2007; "Semiconductor Device And Manufacturing Method Thereof"; Setsuko Wakimoto et al.; pp. 1-32; Figs. 1-14.

FIG. 10
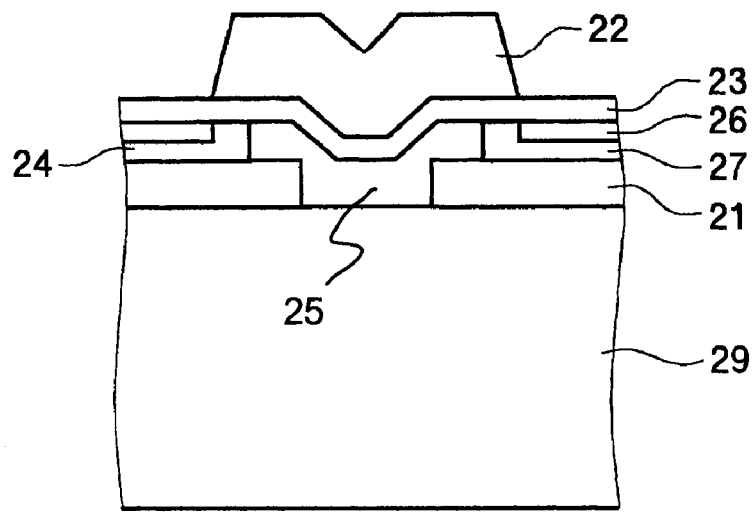
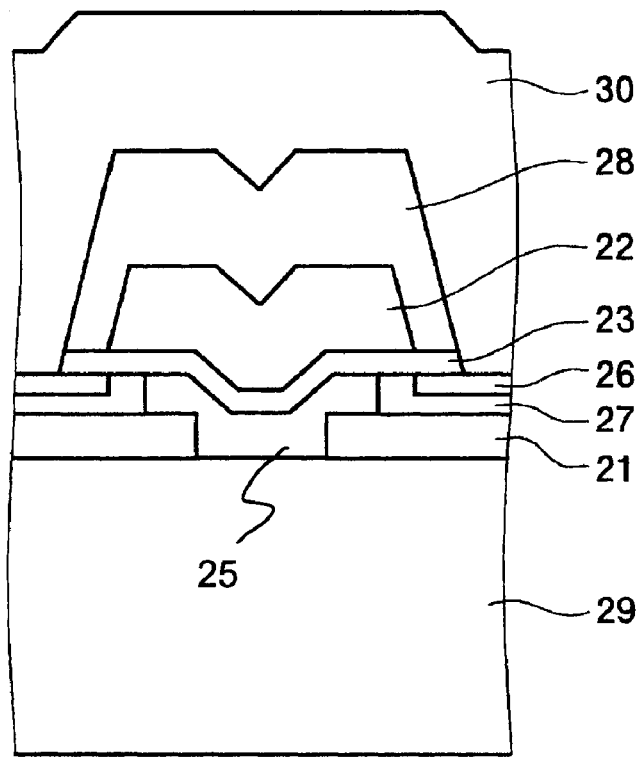
FIG. 11

FIG. 14
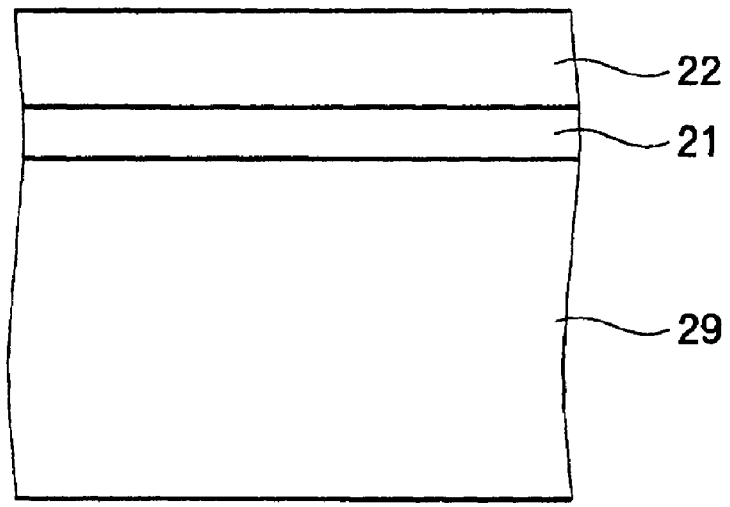
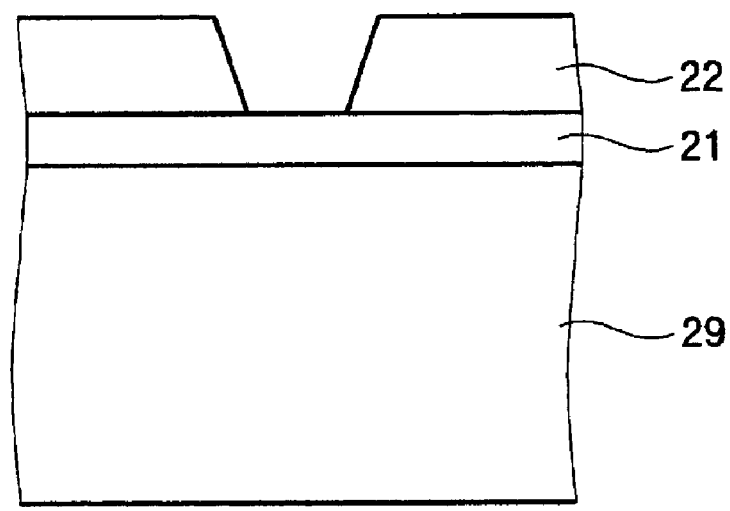
FIG. 15

FIG. 18
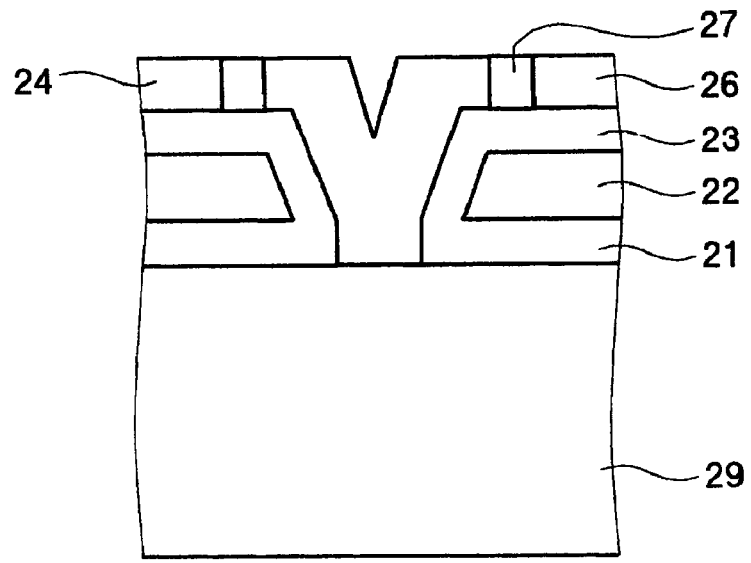
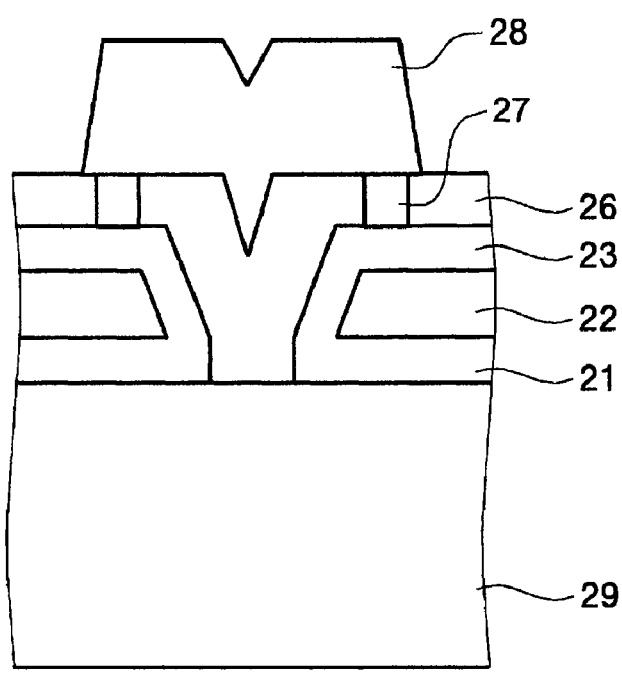
FIG. 19

FIG. 30
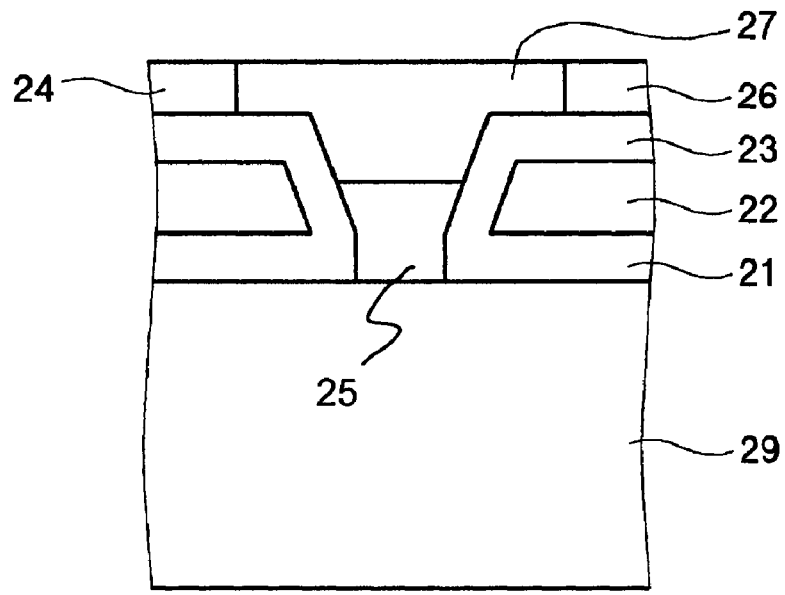
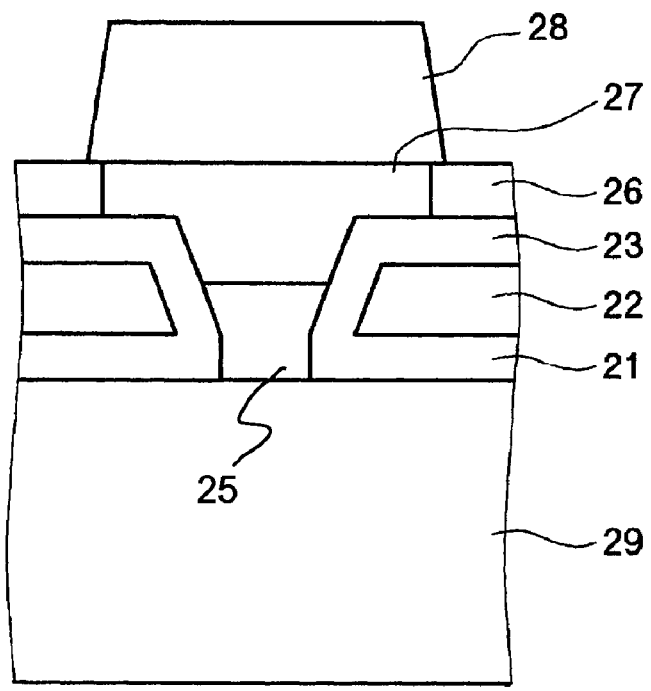
FIG. 31

FIG. 34
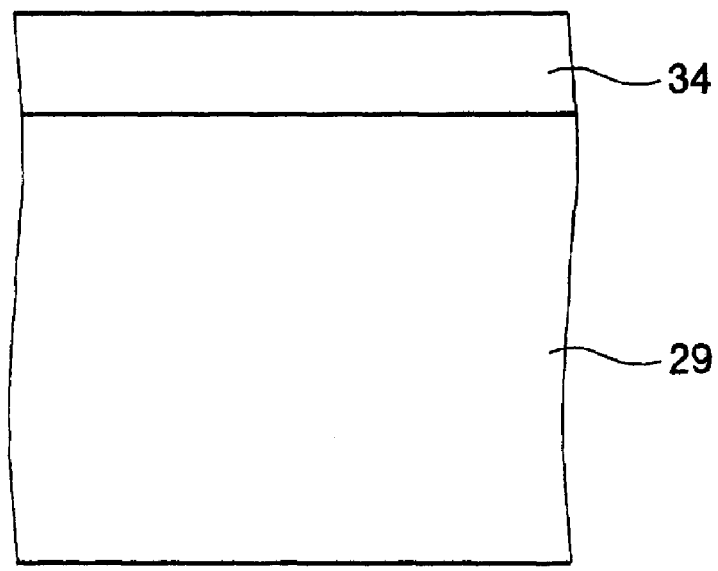
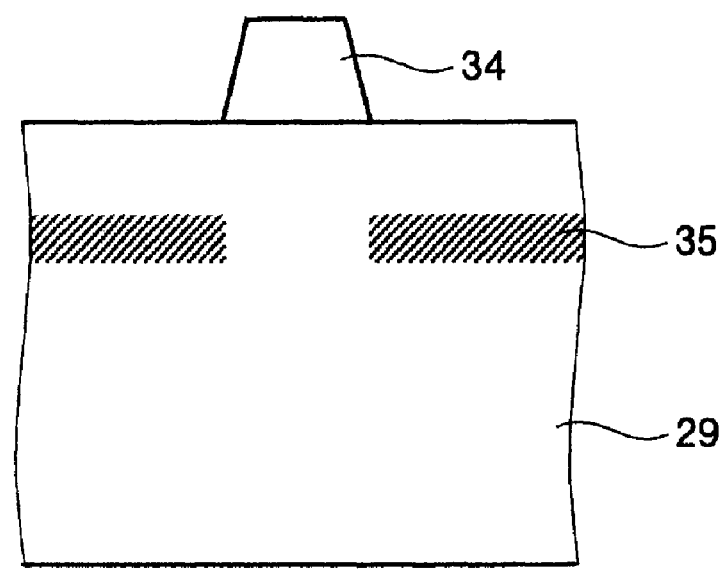
FIG. 35

FIG. 36
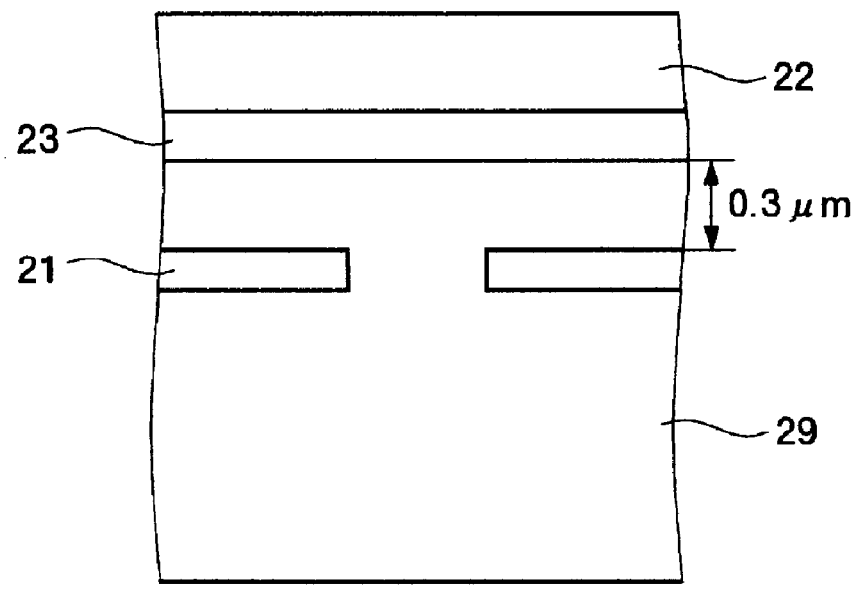
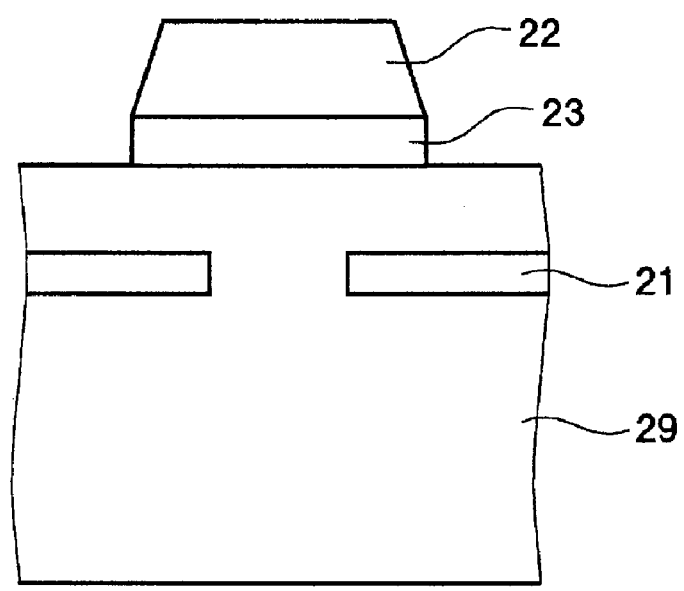
FIG. 37

FIG. 38
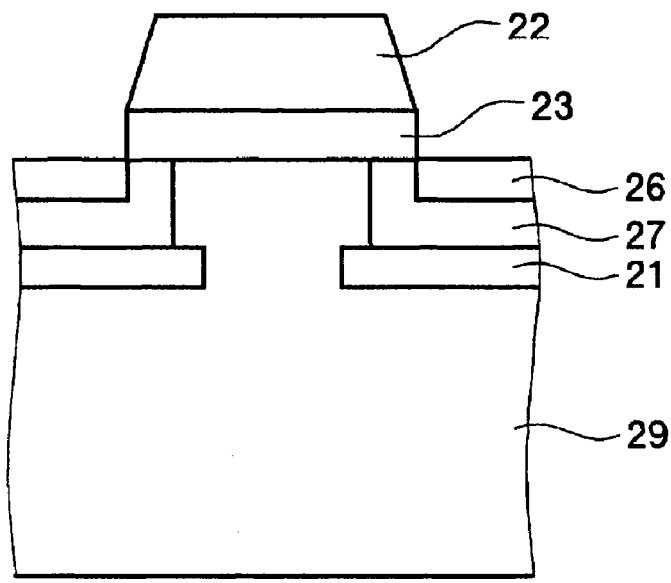
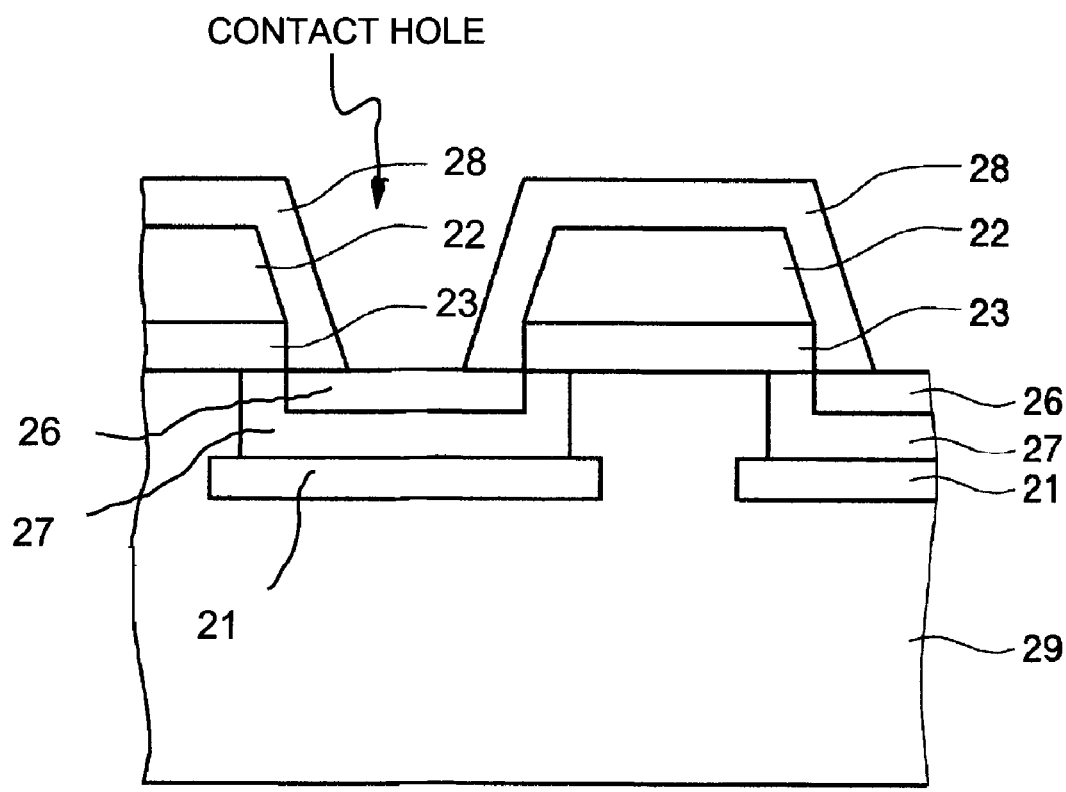
FIG. 39

SEMICONDUCTOR DEVICE AND MANUFACTURING METHOD THEREOF

This is a divisional of U.S. patent application Ser. No. 11/219,308 filed Sep. 2, 2005 now U.S. Pat. No. 7,262,478.

BACKGROUND

Efforts have been made to enhance performance of an IGBT by carrying out many improvements. Here, the performance of an IGBT is identified as a switch that completely cuts off current while holding an applied voltage when turned-off, and allows current to flow with the least possible voltage drop, i.e., with the least possible on-resistance. For purposes of an operation an IGBT, a collector is typically expressed as an "anode" and an emitter is typically expressed as a "cathode."

There exists a tradeoff relationship between the maximum voltage that can be held by an IGBT, i.e., a magnitude of a breakdown voltage, and a voltage drop when the IGBT is turned-on, where an IGBT with a higher breakdown voltage has a higher on-voltage. Ultimately, the limit of the optimum value in the tradeoff relation is determined by physical properties of silicon. For enhancing the optimum value in the tradeoff, property/structural changes are needed to prevent a local electric field concentration buildup when an IGBT holds an applied voltage.

Another important measure representing performance of an IGBT is a tradeoff between an on-voltage and a switching loss (in particular, a turn-off loss). An IGBT, being a switching device, carries out an operation from being turned-on to being turned-off, or from being turned-off to being turned-on. At an instant of such a switching operation, a large loss is produced per unit time. In general, an IGBT with a lower on-voltage is turned-off more slowly and produces a larger turn-off loss. By improving such a tradeoff, performance of an IGBT can be enhanced. Note that a turn-on loss of an IGBT has a little dependence on the on-voltage, but rather largely depends on the characteristics of the free-wheeling diode used in combination with the IGBT.

For optimizing the tradeoff between the on-voltage and the turn-off loss (hereinafter referred to as an on-voltage to turn-off loss relation), it is effective to optimize a distribution of excessive carriers in an IGBT in a turned-on state. For lowering the on-voltage, the amount of excessive carriers can be increased to lower the resistance value of a drift layer. At the turning-off state, however, all of the excessive carriers must be swept out from the device or made to disappear by an electron-hole recombination. Thus, increasing the amount of excessive carriers increases the turn-off loss. Therefore, for optimizing such a tradeoff, it is necessary to minimize the distribution of excessive carriers that causes the turn-off loss by the same lowered on-voltage.

For achieve the optimum tradeoff, it is necessary to lower the carrier concentration on the anode side while increasing the carrier concentration on the cathode side to thereby provide a ratio of the carrier concentration on the anode side to the carrier concentration on the cathode side to about 1:5. Furthermore, it is also necessary to hold the carrier lifetime in the drift layer longest possible so that an averaged carrier concentration in the drift layer becomes high.

When an IGBT is turned-off, the depletion layer expands from the p-n junction on the cathode side to the inside of the drift layer with progress toward the anode layer on the bottom surface. At this time, of excessive carriers in the drift layer, holes are drawn out by an electric field from the end of the depletion layer. This creates an electron excessive state, where the excess electrons are injected into the anode layer in a p-type through a neutral region. Thus, the p-n junction on the anode side is slightly forward-biased, which causes reverse injection of holes with the amount depending on the amount of the injected electrons. The holes brought by the reverse injection merge with holes drawn out by the above-explained electric field and enter the depletion layer.

Carriers (here, holes) carrying electric charges pass through the region of the electric field toward the cathode side. Thus, work is to be done in the electric field on the carriers. The work done on the carriers in the electric field eventually causes lattice vibration of crystal lattices, such as those of silicon, due to collisions of carriers with the crystal lattices, and is dissipated as heat. The dissipated energy becomes the turn-off loss. Note that the energy dissipated due to the carriers drawn out before the depletion layer has extended out is smaller than the energy dissipated due to the carriers being drawn out when the depletion layer has extended out. This is because the depletion layer before having extended out provides a small potential difference when the carriers pass through the depletion layer, by which small work is done in the depletion layer on the carriers in the electric field.

The above explanation is made from the microscopic viewpoint. From the macroscopic view point of the terminal voltage of a device, it means that current flowing before the anode-cathode voltage has finished rising, i.e., flowing while the anode-cathode voltage is rising, makes a smaller contribution to the loss expressed by the product of the voltage and the current (voltage×current) than the current flowing after the anode-cathode voltage has finished rising. From the foregoing, it is known that a carrier distribution deviating to the cathode side by the later-described IE effect causes a smaller turn-off loss than the carrier distribution deviating to the anode side under conditions that a fraction of carriers drawn out under a low voltage is larger and on-voltages to both the distributions are the same.

The carrier concentration on the anode side can be reduced by reducing the total amounts of impurity concentrations in the anode layer. This is not so difficult in itself. However, in an IGBT with a low rated breakdown voltage, such as 600V, for reducing the total amounts of impurity concentrations in the anode layer, the thickness of the wafer must be brought to on the order of 100 μm or below. Because such a thin wafer must be handled during the manufacturing process, the manufacturing technique becomes complicated and difficult. Also, the carrier concentration on the cathode side is increased due to the IE effect.

For a cathode structure with a large IE effect, a structure such as the HiGT structure is proposed in which an n-layer with a high impurity concentration is inserted in a cathode so as to surround a p-base of a planar structure (see JP-A-2003-347549 and JP-T-2002-532885, for example). Moreover, in a trench gate structure, structures such as a CSTBT structure, in which an n-layer having a higher impurity concentration than a drift layer is inserted in a mesa section between the adjacent trenches, and an IEGT (Injection Enhancement Gate Transistor) structure (see JP-A-8-316479, and Omura, et al, "Carrier injection enhancement effect of high voltage MOS devices-Device physics and design concept-", ISPSD '97, pp. 217-220, for example), have been proposed. In general, the IE effect in the trench structure is larger than that in the planar structure.

The IE effect is discussed and reported in Udrea, et al, "A unified analytical model for the carrier dynamics in Trench Insulated Gate Bipolar Transistor (TIGBT)," ISPSD '95, pp.

190-195, for example. An often drawn equivalent circuit of an IGBT is a combination of a MOSFET (Insulated Gate Field Effect Transistor having a Metal-Oxide-Semiconductor structure) and a bipolar transistor. However, with an actual device operation taken into consideration, the equivalent circuit can be regarded, as an equivalent circuit shown in present FIG. 1, which is a combination of a MOSFET 1, a p-n-p bipolar transistor 2, and a p-i-n diode 3 (also disclosed in a co-pending application filed concurrently herewith).

FIG. 2 schematically illustrates a cross sectional view showing an arrangement of a principal part of a planar IGBT. In FIG. 2, the right region 4 identified in dashed lines denotes a p-n-p bipolar transistor region (hereinafter referred to as a p-n-p BJT region) and the left region 5 identified in dashed lines denotes a p-i-n diode region. Moreover, in FIG. 2, the arrows in solid lines represent flow of electron current, while the arrows in dotted lines represent flow of hole current. In the present disclosure, the leading character "n" or "p" preceding the names of the layers and regions means that the majority carriers in the layers and the regions are electrons or holes, respectively. Moreover, a region (including a layer) named with a leading character "n$^+$" or "p$^+$" means that the region (including the layer) has a higher impurity concentration than the region (including the layer) named with the leading character "n" or "p" without the sign "+", respectively. Furthermore, a region (including a layer) named with a leading character "n$^{++}$" means that the region (including the layer) has a higher impurity concentration than the region (including the layer) named with the leading character "n$^+$".

As shown in FIG. 2, electrons flow from an n$^{++}$-region 6 on the surface of a MOS section to a p-anode layer 11 on the bottom surface through an n$^+$-inversion layer 8 on a p-layer 7 surrounding the n$^{++}$-region 6 and an n$^+$-electron accumulation layer 10 on the surface of an n$^-$-drift layer 9. Part of the electron current becomes a base current of the p-n-p BJT region 4. In the p-n-p BJT region 4, holes flowing from the p-anode layer 11 by diffusion or drift are only flow in the p-layer 7, and the p-n junction between the p-layer 7 and the n$^-$-drift layer 9 is slightly reverse-biased. Therefore, the concentration of minority carriers, i.e., holes in the n$^-$-drift layer 9 near the p-n junction is extremely low.

The n-cathode in the p-i-n diode region 5 is the n$^+$-electron accumulation layer 10 on the surface of the n$^-$-drift layer 9. Since the junction between the n$^+$-electron accumulation layer 10 and the n$^-$-drift layer 9 (hereinafter abbreviated as the n$^+$/n$^-$-junction) is slightly forward-biased, electrons are injected into the n$^-$-drift layer 9. When large current flows, an electron concentration becomes far higher than the doping concentration in the n$^-$-drift layer 9 (a high-injection state). Moreover, for satisfying the charge neutrality condition, there exist holes with the same concentration as that of electrons. Therefore, the concentration of minority carriers, i.e., holes, in the n-drift layer 9 near the n$^+$/n$^-$-junction is extremely high.

For achieving the optimum carrier distribution with a deviation to the cathode side in an IGBT, it is important to reduce the p-n-p BJT region 54 and to increase a p-i-n diode region 55. Moreover, it is very important to increase the amount of forward bias across the n$^+$/n$^-$ junction to enhance electron injection. In every previously proposed structure having the IE effect, proportion of the p-i-n diode region is increased while attaining an increase in an amount of forward bias across the n$^+$/n$^-$-junction.

Note that in an IGBT with a planar structure, reduction in proportion of a region occupied by a p-base in a cell pitch reduces an on-voltage. The reason for this is due to the increase in the proportion of the p-i-n diode region with an additional rise in a lateral current density near the surface that caused an increase in a voltage drop, which enhances the effect of increasing the forward bias across the n$^+$/n$^-$ junction. The reason for increasing the forward bias across the n$^+$/n$^-$-junction is that the electric potential of the n$^+$-layer, having low resistance, is equal to the cathode electric potential, while the electric potential of the n$^-$-layer, having high resistance, is raised by the voltage drop due to the large current.

In the same way, in an IGBT with a trench structure, by reducing proportion of the p-n-p BJT region, the IE effect can be enhanced. Reduction in proportion of the p-n-p BJT region can be made by bringing the p-base region to a floating state in a mesa section, for example. Moreover, the IE effect can be also enhanced by making the trench deeper to isolate the bottom of the trench from the p-n junction. Furthermore, by narrowing the width of the mesa section, the IE effect also can be enhanced. This, in both cases, is considered to be due to the increase in the hole current flowing in the mesa section that increases the forward bias across the n$^+$/n$^-$-junction due to a voltage drop.

Here, letting Nd be the doping concentration in the drift layer and Vn be the forward bias applied across the n$^+$/n$^-$-junction, the electron density n on the n$^-$-layer side of the n$^+$/n$^-$-junction can be expressed by the following expression, where k is Boltzmann constant and T is an absolute temperature:

$$n = Nd * \exp(Vn/kT).$$

As is apparent from the above expression, depending on the forward bias applied to the n$^+$/n$^-$-junction, the electron density on the cathode side is exponentially increased. To increase the amount of the forward bias, a voltage drop caused by a large current can be used. Moreover, as are described in JP-A-2003-347549, JP-T-2002-532885 and JP-A-8-316479, the amount of the forward bias can be increased by also increasing the n-type impurity concentration in the n$^+$-layer. However, the HiGT structure described in JP-A-2003-347549, being a planar structure, causes a large reduction in the forward breakdown voltage when the n-type impurity concentration in the n$^+$ buffer layer on the surface side is excessively high.

In the CSTBT structure described in JP-A-8-316479, the n$^+$-buffer layer on the surface side is held between the trench gate oxide films with its electric potential continuing to the electric potential of the polysilicon through the gate oxide film. This depletes the n$^+$-buffer layer on the surface side not only from the p-n junction but also from the boundaries of the trench gate oxide films on both sides. Thus, the n$^+$-buffer layer on the surface side is completely depleted with a low forward bias. Therefore, although the n$^+$-buffer layer on the surface side has a high impurity concentration, the electric field strength inside the layer is reduced. Even though the forward bias is further increased, the reduced electric field strength in the mesa section between the trenches hardly makes a local peak in the electric field.

This holds true to the principle of the MOSFET with a superjunction structure that includes in a drift section, instead of including a drift layer formed with a uniform layer of a single conductivity type, a parallel p-n structure in which vertical-layer-like n-type regions, each with an increased impurity concentration, and vertical-layer-like p-type regions are alternately joined. Thus, the CSTBT structure has such characteristics that enhance the IE effect and yet make it hard to lower the forward breakdown voltage. The n$^+$-buffer layer on the surface side causes, between the n$^-$-drift layer, a diffusion potential that becomes a potential barrier for holes. Thus, the hole concentration in the drift layer is increased (the first explanation).

As another explanation (the second explanation) for the reason, it can be said that the n$^+$-buffer layer on the surface side and the n-drift layer being forward-biased causes electrons to be injected from the n$^+$-buffer layer. Namely, in the n$^+$/n$^-$-junction, the n$^+$-layer with a high impurity concentration increases the electron injection efficiency, which increases the fraction of an electron current injected into the n$^-$-layer to hole current flowing in the n$^+$-layer. For allowing holes to flow in the n$^+$-layer by diffusion as minority carriers, the n$^+$/n$^-$ junction must be forward-biased. Since the higher the impurity concentration in the n$^+$-layer is, the smaller the concentration of holes as minority carriers in a thermal equilibrium state becomes, a higher amount of a forward bias becomes necessary for still allowing the same amount of hole current to flow with the impurity concentration in the n$^+$-layer made higher. Since a higher forward voltage increases an electron current flowing into the n$^-$-layer, an electron concentration is increased. The second explanation expresses the previous first explanation physically in different words. As explained above, it is known that, even in a related IGBT, such an element structure that deviates the carrier distribution to the cathode side due to the IE effect, is preferably provided for optimizing the on-voltage to turn-off loss tradeoff.

However, the above-explained optimization of the on-voltage to turn-off loss tradeoff cannot always be said to be sufficient. It is considered that the carrier density on the cathode side in the on-state must be further increased. Namely, it is not considered yet that the IE effect is sufficiently exhibited in such a MOS gate semiconductor device as a related IGBT, for example. For example, even in a device to which a trench gate structure is adopted as in the above-explained CSTBT structure or IEGT structure, although the tradeoff characteristic is improved better than that in a previous device, there are still possibilities for improvement by further miniaturization.

The manufacturing process of a semiconductor device with the trench gate structure, however, (although the manufactured trench gate structure exhibits a certain effect of improving the tradeoff as explained above) is longer and more complicated as compared with the manufacturing process of a semiconductor device with the planar structure. Thus, the rate of acceptable products of a semiconductor device with the trench gate structure is lower than the rate of acceptable products of a semiconductor device with the planar structure, which is liable to increase the product cost of the semiconductor device with the trench gate structure relatively higher than that of the semiconductor device with the planer structure.

In addition, further miniaturization of the semiconductor device with the trench gate structure regardless of the enhancing characteristics of the semiconductor device will result in a higher manufacturing cost. In the semiconductor device with the trench gate structure, an electric field concentration is liable to occur particularly at the bottom of the trench, to easily cause a breakdown in dielectric strength or avalanche breakdown, which is liable to degrade the on-voltage to breakdown voltage tradeoff. Moreover, the structure has a problem in that, when the electric potential of the gate is made negative to that of the cathode, the electric field strength at the bottom of the trench increases to further degrade the breakdown voltage.

Accordingly, there remains a need to solve the above problems and provide a semiconductor device and a method of manufacturing the device with further improved performance, namely providing a semiconductor device capable of further improving the tradeoff between the on-voltage and the turn-off loss. The present invention addresses this need.

SUMMARY OF THE INVENTION

The present invention relates to a semiconductor device and a manufacturing method thereof, and particularly to a power semiconductor device forming an IGBT (Insulated Gate Bipolar Transistor) and a manufacturing method thereof.

One aspect of the present invention is a semiconductor device that includes a single-crystal semiconductor substrate that can be of a first conductivity type.

In one embodiment, the semiconductor device can include a first insulator film, a polycrystalline semiconductor region, a second insulator film, a first semiconductor region, a second semiconductor region, a third semiconductor region, a first electrode, a third insulator film, a fourth semiconductor region, and a second electrode.

The first insulator film selectively covers a first principal surface of the substrate, and has an opening or window. The polycrystalline semiconductor region is formed on the first insulator film. The second insulator film covers the polycrystalline semiconductor region. The first semiconductor region can be of a first conductivity type and is in contact with the substrate in the opening of the first insulator film. The second semiconductor region can be of the first conductivity type and is formed on the second insulator film outside the opening of the first insulator film. The third semiconductor region can be of a second conductivity type and is provided on the second insulator film between the first semiconductor region and the second semiconductor region. The first electrode is in contact with both the second semiconductor region and the third semiconductor region. The third insulator film is formed between the first electrode and the first semiconductor region. The fourth semiconductor region can be of the second conductivity type and is provided along a second principal surface of the substrate. The second electrode is in contact with the fourth semiconductor region.

In another embodiment, the first semiconductor region can be of the first conductivity type and in contact with the substrate in the opening of the first insulator film. The second semiconductor region can be of the second conductivity type and is on the first insulator film outside the opening thereof. The third semiconductor region can be of the first conductivity type and is in the second semiconductor region. The second insulator film covers the first semiconductor region, the second semiconductor region, and the third semiconductor region. The polycrystalline semiconductor region is on the second insulator film. The first electrode is in contact with both the second semiconductor region and the third semiconductor region. The third insulator film is formed between the first electrode and the polycrystalline semiconductor region. The fourth semiconductor region can be of the second conductivity type and formed along the second principal surface of the substrate. The second electrode is in contact with the fourth semiconductor region.

In yet another embodiment, the first insulator film is selectively buried under the first principal surface of the substrate. The first semiconductor region can be of the second conductivity type and is positioned between the first insulator film and the first principal surface. The second semiconductor region can be of the first conductivity type and is formed in the first semiconductor region. The second insulator film covers the region of the first principal surface other than where the first insulator film is buried. The polycrystalline semiconductor region is provided on the second insulator film. The first electrode is in contact with both the first semiconductor region and the second semiconductor region. The third insulator film is formed between the first electrode and the polycrystalline semiconductor region. The third semiconductor region can be of the second conductivity type and is formed along a second principal surface of the substrate. The second electrode is in contact with the second semiconductor region.

In the above embodiments, the first semiconductor region of the first conductivity type has an impurity concentration higher than an impurity concentration of the substrate. A fifth semiconductor region of the first conductivity type can be provided between the substrate and the fourth semiconductor region. The fifth semiconductor region also has an impurity concentration higher than the impurity concentration of the substrate. The first semiconductor region, the second semiconductor region, and the third semiconductor region can be composed of a semiconductor film entirely made of polycrystalline silicon or at least partly made of single crystal silicon. A fourth semiconductor region of the first conductivity type can be provided between the substrate and the third semiconductor region; the fourth semiconductor region has an impurity concentration higher than an impurity concentration of the substrate.

The device can further include a second conductivity type diffused layer independently provided in each cell. The diffused layer can be in a section of the substrate where the first semiconductor region is in contact with the substrate in the opening of the first insulator film. The second conductivity type diffused layer becomes completely depleted when an applied voltage at forward voltage blocking is a voltage within a range of causing no avalanche breakdown in any part in the device. A first conductivity type diffused layer can be provided in a section of the second conductivity type diffused layer where the first semiconductor region is in contact with the second conductivity type diffused layer in the opening of the first insulator film. The first conductivity type diffused layer becomes completely depleted when an applied voltage at forward voltage blocking is a voltage within a range of causing no avalanche breakdown in any part in the device. The first conductivity type diffused layer extends to under the polycrystalline semiconductor region.

Another aspect of the invention is a method of manufacturing the semiconductor device mentioned above. One method can include forming the first insulator film and the polycrystalline semiconductor film in the order on the first principal surface of the substrate; forming the window or opening by removing part of the polycrystalline semiconductor film to expose part of the first insulator film; covering the polycrystalline semiconductor film and the exposed part of the first insulator film in the window with the second insulator film; exposing part of the substrate in the window by removing the second insulator film and the first insulator film occupying the window; depositing the first conductivity type semiconductor film on the exposed part of the substrate in the window and on the second insulator film; forming in the first conductivity type semiconductor film the first semiconductor region of the first conductivity type and the second semiconductor region of the second conductivity type adjacent to the first semiconductor region as a region in contact with the substrate in the window; forming in the first conductivity semiconductor film the third semiconductor region of the first conductivity type on the opposite side of the first semiconductor region with the second semiconductor region positioned therebetween; depositing the third insulator film on the first semiconductor region, the second semiconductor region, and the third semiconductor region, and forming a contact hole in the third insulator film to expose part of the third semiconductor region and part of the second semiconductor region; forming the first electrode in contact with the exposed part of the third semiconductor region and the exposed part of the second semiconductor region through the contact hole; grinding the second principal surface of the substrate to form the fourth semiconductor region of the second conductivity along the ground second principal surface; and forming the second electrode in contact with the fourth semiconductor region.

Another method can include forming the first insulator film on the first principal surface of substrate; forming the window by removing part of the first insulator film to expose the substrate; depositing the first conductivity type semiconductor film on the first insulator film and the exposed part of the substrate in the window; forming the second insulator film and the polycrystalline semiconductor film in the order on the first conductivity type semiconductor film; removing part of the polycrystalline semiconductor film so that the polycrystalline semiconductor film remaining forms a first semiconductor region of the first conductivity type as a region in which the first conductivity type semiconductor film is in contact with the substrate in the window; forming the second semiconductor region of the second conductivity type in the first conductivity type semiconductor film between the first insulator film and the second insulator film; forming the third semiconductor region of the first conductivity type in the second semiconductor region; depositing the third insulator film on the polycrystalline semiconductor film, forming the contact hole in the third insulator film to expose part of the third semiconductor region and part of the second semiconductor region, and forming on the third insulator film the first electrode in contact with the exposed part of the third semiconductor region and the exposed part of the second semiconductor region through the contact hole; grinding the second principal surface of the substrate to form the fourth semiconductor region of the second conductivity along the ground second principal surface; and forming the second electrode in contact with the fourth semiconductor region.

Another method includes selectively burying the first insulator film under the first principal surface of the substrate; forming the second insulator film and the polycrystalline semiconductor film on the first principal surface, and removing part of the polycrystalline semiconductor film and part of the second insulator film, leaving the polycrystalline semiconductor film and the second insulator film remaining over a region of the first principal surface other than a region under which the first insulator film is buried; forming a first semiconductor region of a second conductivity type in the substrate between the first insulator film and the first principal surface, and further forming a second semiconductor region of the first conductivity type in the first semiconductor region; depositing the third insulator film on the polycrystalline semiconductor film, and forming the contact hole in the third insulator film to expose part of the second semiconductor region and part of the first semiconductor region; forming the first electrode in contact with the exposed part of the second semiconductor region and the exposed part of the first semiconductor region through the contact hole; grinding the second principal surface of the single crystal semiconductor substrate to form third semiconductor region of the second conductivity along the ground second principal surface; and forming the second electrode in contact with the third semiconductor region.

In the above methods, the first conductivity type semiconductor film can be formed with polycrystalline silicon or at least partly formed with single crystal silicon. The first conductivity type semiconductor film can formed by an epitaxial growth. Oxygen ions can be selectively implanted in the single crystal semiconductor substrate for forming the first insulator film. The first insulator film can be formed by annealing the substrate at temperature of 1000° C. or higher after the oxygen ions are implanted in the substrate. The method can also include ion implanting into the substrate through the window in the polycrystalline semiconductor film to form independently in each cell the second conductivity type diffused layer in self-alignment in the section in the substrate with the first semiconductor region. The first conductivity type diffused layer can be formed in a section of the second diffused layer with which the second semiconductor region is in contact. The fourth or fifth semiconductor region of the first conductivity type can be formed along the ground second principal surface at a depth from the second principal surface greater than a depth of the third or fourth semiconductor region, respectively.

BRIEF DESCRIPTION OF THE DRAWINGS

FIGS. 7-13 schematically illustrate cross sectional views for explaining the manufacturing method of the third embodiment, the steps following the step shown in FIG. 6.

FIG. 14 schematically illustrates a cross sectional view for explaining a manufacturing method of an IGBT according to the fourth embodiment, where an oxide film and polysilicon are formed on a single crystal silicon substrate.

FIGS. 15-21 schematically illustrate cross sectional views for explaining the manufacturing method of the fourth embodiment, the steps following the step shown in FIG. 14.

FIGS. 30-33 schematically illustrate cross sectional views for explaining the manufacturing method of the fifth embodiment, the steps following the step shown in FIG. 29.

FIG. 34 schematically illustrates a cross sectional view for explaining a manufacturing method of an IGBT according to the sixth embodiment, where an oxide film is grown on a single crystal silicon substrate.

FIGS. 35-41 schematically illustrate cross sectional views for explaining the manufacturing method of the sixth embodiment, the steps following the step shown in FIG. 34.

DETAILED DESCRIPTION

To enhance electron injection from a surface thereof, a structure with a large IE effect has been studied. As a result, it has been found that a structure having the following features is effective. First, an $n^+$-buffer layer with a high impurity concentration is inserted between a p-base layer on a surface side and a drift layer. However, for preventing electric field strength from becoming excessively large when forward-biased, a structure that reduces the electric field strength is adopted. Second, portion of an area of a p-n-p BJT is made as smallest as possible. However, care must be taken because an effective peripheral length of a channel made excessively small results in a large drop in the on-voltage in the channel section. Third, a current path along which holes flow until flowing in the p-base layer is made narrow and long. With such a structure, the on-voltage to turn-off loss tradeoff can be improved.

Exemplary embodiments of a semiconductor device and a method of manufacturing the device according to the invention will be explained in detail with reference to the attached drawings. In the following explanations, the first conductivity type is taken as an n-type and the second conductivity type is taken as a p-type. The invention, however, is similarly applicable with the conductivity types reversed.

Figure 1:
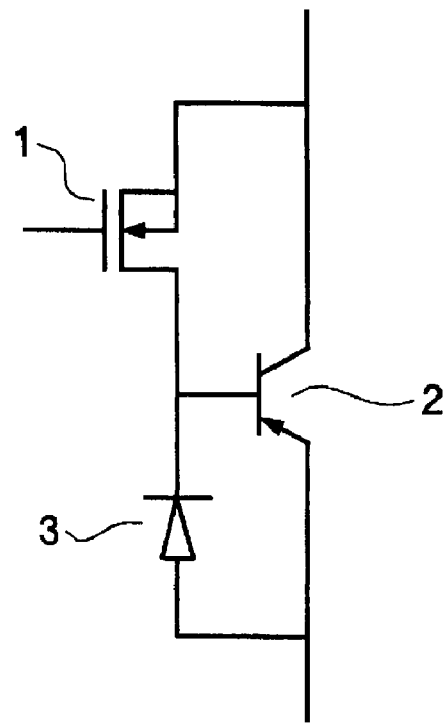
FIG. 1 is a schematic diagram of an equivalent circuit of an IGBT
Figure 2:
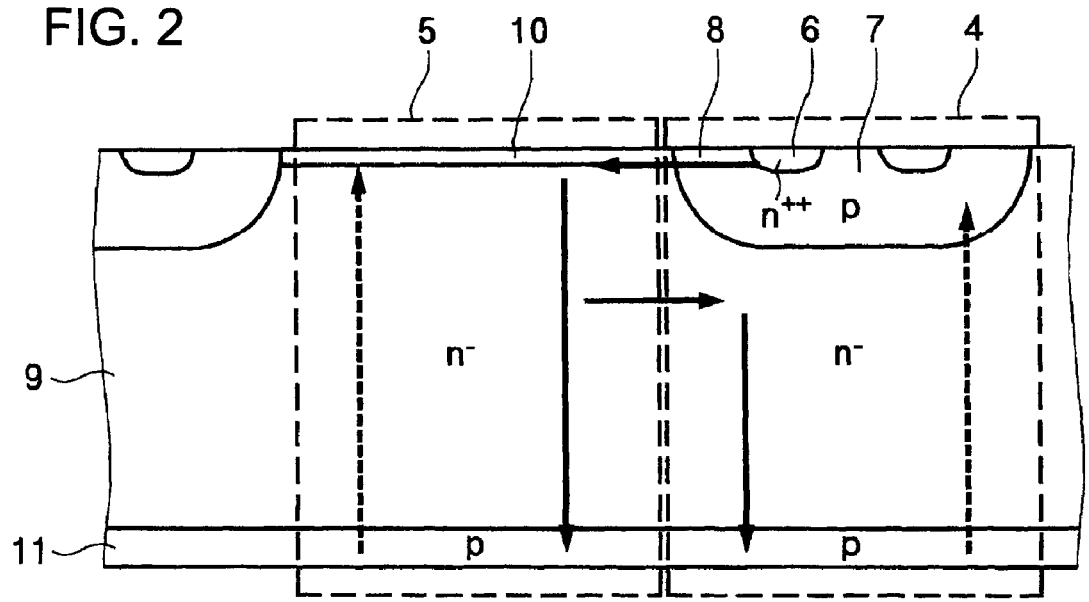
FIG. 2 schematically illustrates a cross sectional view of a principal part of a planar IGBT.
Figure 3:
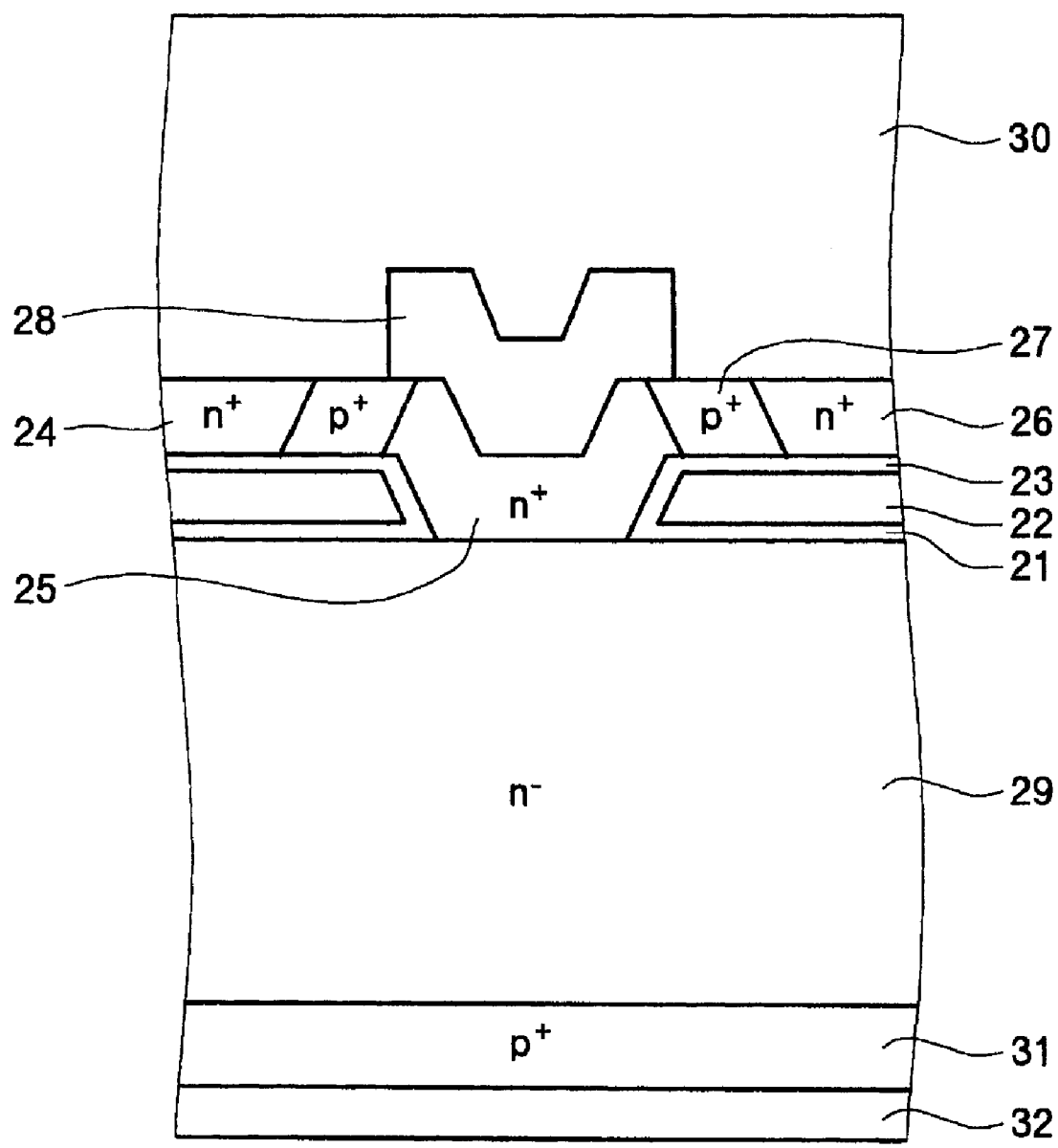
FIG. 3 schematically illustrates a cross sectional view of an IGBT according to the first embodiment.

FIG. 3 illustrates a first embodiment of an IGBT. On a first principal surface of an n$^-$-single crystal silicon substrate 29 as a drift layer, an oxide film (a first insulator film) 21, for example, is selectively formed. On the oxide film 21, polysilicon (hereinafter referred to as "gate polysilicon") 22 as a gate electrode is deposited. The surface of the gate polysilicon 22 is covered with a gate oxide film (a second insulator film) 23.

The surface of the gate oxide film 23 and a section of the n-single crystal silicon substrate 29 not covered with any oxide film 21 are covered with a cathode film 24 doped with an n-type with the impurity concentration higher than that of the drift layer (n$^-$-single crystal silicon substrate 29). The cathode film 24 can be made of, for example, polysilicon, or made of n-type single crystal silicon epitaxially grown from the section of the n$^-$-single crystal silicon substrate 29 covered with no oxide film 21. A section of the cathode film 24 in contact with the n$^-$-single crystal silicon substrate 29 becomes an n$^+$-buffer region (a first semiconductor region of a first conductivity type) 25.

In the cathode film 24, in the section next to the n$^+$-buffer region 25 and in contact with the gate oxide film 23, a p$^+$-base region (a third semiconductor region of a second conductivity type) 27 selectively doped with a p-type with a high impurity concentration is provided. In the section on the side of the p$^+$-base region 27 opposite to the n$^+$-buffer region 25, an n$^+$-source region (a second semiconductor region of the first conductivity type) 26 having a very high impurity concentration is formed. On the cathode film 24, an interlayer insulator film (a third insulator film) 28 made of an oxide film made of a material such as BPSG (Bolo-Phospho Silicate Glass), for example, is formed.

Figure 20:
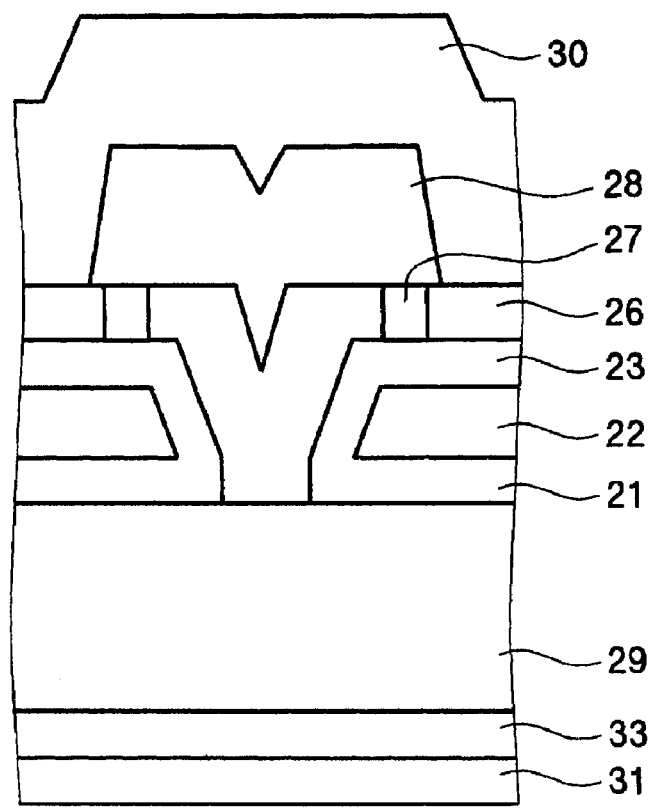

Over the interlayer insulator film 28, the n$^+$-source region 26 and the p-base region 27, an aluminum layer as an emitter electrode (a first electrode) 30 is formed. The emitter electrode 30 is in contact with part of or the entire n$^+$-source region 26, and is in contact with part of the p-base region 27. On a second principal surface of the n$^-$-single crystal silicon substrate 29, a p$^+$-anode layer (a fourth semiconductor region of the second conductivity type) 31 is formed. On the surface of the p$^+$-anode layer 31, an aluminum layer as an anode electrode (a second electrode) 32 is formed. Although not particularly illustrated, between the drift layer and the p$^+$-anode layer 31, an n$^+$-buffer layer (a fifth semiconductor region of the first conductivity type) having an impurity concentration higher than the impurity concentration of the drift layer (the n-single crystal silicon substrate 29) can be provided, such as illustrated in FIG. 20.

Here, the reason for forming the n-drift layer, which holds a breakdown voltage at blocking and allows a current to flow at conduction, with the n$^-$-single crystal silicon substrate 29 is as follows. Namely, the drift layer, being arranged in one dimensional, has no complicated structure. Thus, the drift layer is a section whose physical properties exerts influence on the characteristics of the device itself, so that physical characteristic values of the layer (values of carrier mobility and carrier lifetime) can be kept at the maximum. Therefore, it is indispensable to use a single crystal. While, as for the cathode and the anode, the physical characteristic values of materials forming them are not the most important factors but their structures are important. The IGBT according to the embodiment is characterized in that the cathode region is structurally separated from the drift layer, which is effective in enhancing the IE effect.

Next, the working-effect of the first embodiment will be explained, with the cathode film 24 is selected from polysilicon. Application of a voltage, positive to the emitter, to the gate electrode (the gate polysilicon 22) causes the region of the p$^+$-base region 27 near the interface with the gate oxide film 23 to be inverted into the n-type to form a channel. A forward bias applied across the collector and the emitter causes electrons to flow into the drift layer (the n-single crystal silicon substrate 29) through the channel and an electron accumulation layer (the n$^+$-buffer region 25), to reach the p$^+$-anode layer 31 on the bottom surface (the second principal surface). This causes the p-n junction on the bottom surface side, i.e., the junction between the p$^+$-anode layer 31 and the drift layer, to be forward-biased to allow holes to be injected from the p$^+$-anode layer 31 to the drift layer.

The injected holes, on arriving at the surface of the drift layer (the first principal surface), enter the n$^+$-buffer region 25. Part of the holes entering the n$^+$-buffer region 25 disappears in the n$^+$-buffer region 25 by the recombination with electrons. The rest of the holes pass through the n$^+$-buffer region 25 and flow into the p$^+$-base region 27. The hole current, flowing in the narrow and long polysilicon region (the cathode film 24), causes a voltage drop. Therefore, an n$^+$/n$^-$-junction formed with the n$^+$-buffer region 25 as an electron accumulation layer and the n$^-$-drift layer is forward-biased. This allows electrons to be injected to enhance the electron concentration on the cathode side. According to the enhanced electron concentration, holes with the same concentration are accumulated for satisfying the charge neutrality condition.

Moreover, the holes, being injected into the n$^+$-buffer region 25, also make the n$^+$-n$^-$ junction forward-biased, by which electrons are injected. The polysilicon region (the cathode film 24) and the n-single crystal silicon substrate 29 are separated from each other by the oxide film 21 in most of their parts, namely except for the n$^+$-buffer region 25. Therefore, the p-n-p BJT region is a small part of the device and is mostly made of a p-i-n diode region. Moreover, a channel can be formed over the most part of the area of the device to also allow the peripheral length of the channel to be freely increased. However, an excessively increased peripheral length results in excessively high transfer characteristics of the device that increase a limited current at short-circuit to lower short-circuit capability. Therefore, this must be taken into consideration in determining the peripheral length.

In the next, an explanation will be made about an operation at blocking mode in which a forward bias is applied between the collector and the emitter with a gate potential made equal or negative to an emitter potential. In the blocking mode, a depletion layer expands from the p-n junction formed with the p$^+$-base region 27 and the n$^+$-buffer region 25. At the same time, a depletion layer also expands from the gate oxide film 23. This is because the n$^+$-buffer region 25 is biased positively to the gate electrode whose electric potential is equal to or lower than the emitter potential. The n$^+$-buffer region 25, having the thickness equal to the thickness of the polysilicon (cathode film 24), is sufficient to completely deplete by a slight forward bias. With the total amount of the impurity in the n$^+$-buffer region 25 prepared at the amount equal to or lower than a certain one, the maximum electric field strength in the n$^+$-buffer region 25 can be restricted.

With the forward bias increased further, the depletion layer extends into the n$^-$-drift layer 29. Most of the applied forward bias is held by the n-drift layer. This can prevent generation of local peaks in the electric field strength in the cathode region to hardly cause local avalanche breakdowns. Thus, a sufficiently high breakdown voltage can be ensured. As a result, there is no degradation in the on-voltage to breakdown voltage tradeoff. This is an excellent advantage over the related planar or trench IGBT, which is difficult to avoid local electric field concentrations.

Polysilicon is inferior to single crystal silicon in terms of mobility and a carrier lifetime. The mobility and the carrier lifetime in polysilicon, however, can be recovered to a large extent by annealing the polysilicon at high temperatures of 1000° C. or above. Technology has been developed to recover mobility while controlling crystal grain sizes by laser annealing. It is considered that the use of such technology can reduce variations in characteristics such as threshold value and transfer characteristics.

Figure 4:
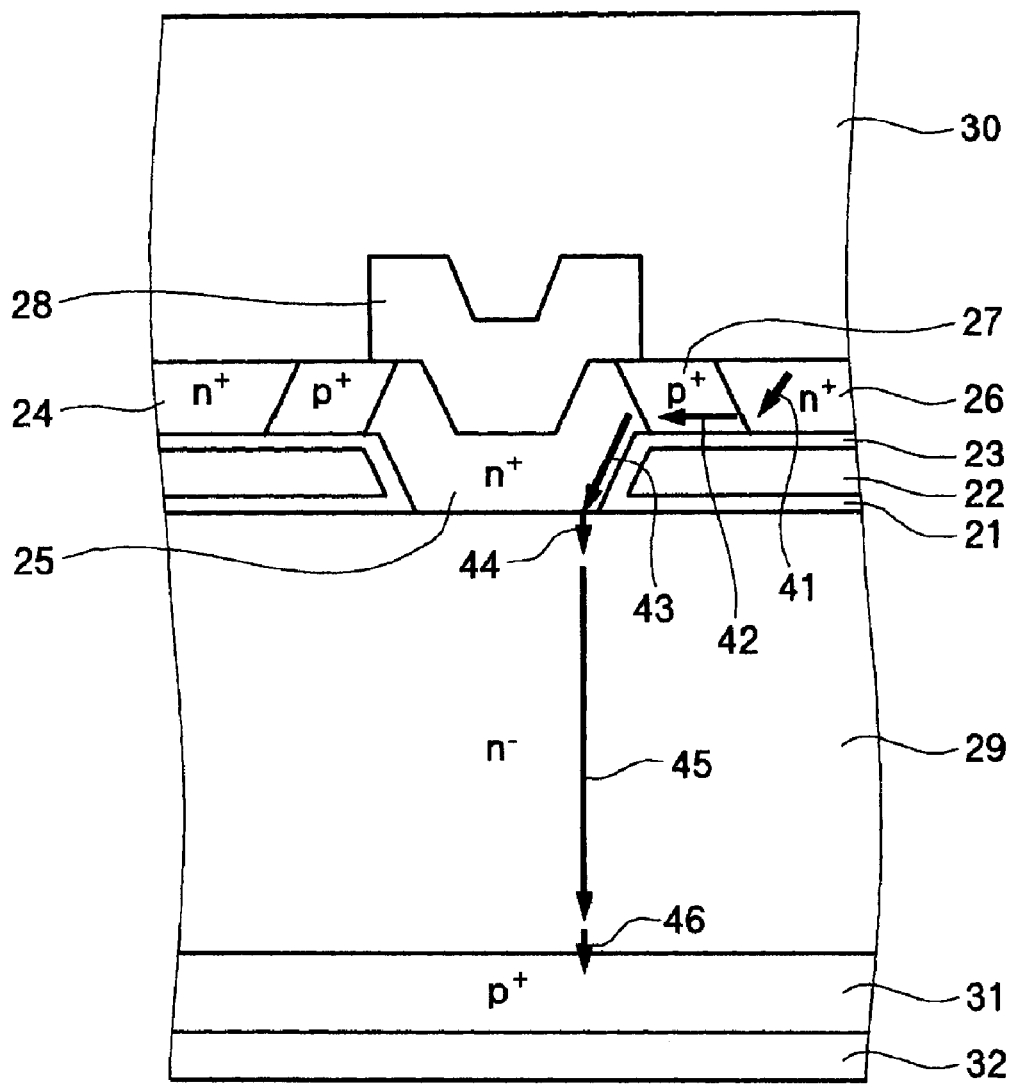
FIG. 4 schematically illustrates a cross sectional view for explaining voltage shares in a turned-on state in the IGBT shown in FIG. 3.

In FIG. 4, there are shown voltage shares in a turned-on state in the IGBT with the arrangement shown in FIG. 3. As shown in FIG. 4, the on-voltage of the IGBT has a value of the sum of the voltage drop in the $n^+$-source region 26 shown by an arrow 41, the voltage drop in the channel region (the $p^+$-base region 27) shown by an arrow 42, the voltage drop in the $n^+$-buffer region 25 shown by an arrow 43, the forward bias across the $n^+$-buffer region 25 and the $n^-$-drift layer (the $n^-$-single crystal silicon substrate 29) shown by an arrow 44, the voltage drop in the $n^-$-drift layer shown by an arrow 45, and the voltage drop between the n-drift layer 29 and the $p^+$-anode layer 31 shown by an arrow 46.

In the $n^+$-source region 26, significantly high doping concentration provides low resistance despite low mobility of carriers, which therefore causes little voltage drop. Moreover, in the embodiment, since the peripheral length of the channel region (the $p^+$-base region 27) can be comparatively freely determined, by increasing the peripheral length so as to compensate for the voltage drop due to degradation in mobility, the voltage drop can be brought to the same degree as that of the related IGBT. In the $n^+$-buffer region 25, low mobility of carriers in polysilicon causes a slight increase in the voltage drop. The voltage drop, however, makes a small contribution to the total on-voltage as will be shown. Conversely, the voltage drop in the $n^+$-buffer region 25 makes the electric potential of the n-drift layer higher to the emitter potential. While, in the electron accumulation layer on the surface of the $n^+$-buffer region 25, a significantly high electron concentration (around $1 \times 10^{19}$ cm$^{-3}$) and low electric resistance cause a small voltage drop.

This makes a junction formed with the $n^+$-electron accumulation layer and the $n^-$-drift layer further forward-biased, so that electrons are easily injected. Namely, the voltage drop in the $n^+$-buffer region 25 makes the carrier distribution in the $n^-$-drift layer in a surface-deviated shape. This optimizes the on-voltage to turn-on loss tradeoff. This means that the voltage drop in the n-drift layer, occupying most of the on-voltage share, particularly in a high breakdown voltage IGBT, is minimized to a certain turn-off loss.

A short lifetime and low mobility of carriers in the $n^+$-buffer region 25 shorten the diffusion length of holes as minority carriers to increase the recombination of carriers in the $n^+$-buffer region 25. This decreases the hole current passing through the $p^+$-base region 27 and flowing in the emitter electrode 30. Thus, the hole current contributing to latchup is decreased to enhance the latchup capability.

Here, when the physical properties of polysilicon is intentionally not recovered, the diffusion length of the hole in the $n^+$-buffer region 25 becomes significantly shorter than the length of the $n^+$-buffer region 25. Thus, most of the holes disappear in the $n^+$-buffer region 25 by the recombination with electrons, so that no hole current reaches the $p^+$-base region 27. In this case, realization of an IGBT causing no latchup, i.e., a latchup-free IGBT is enabled. The operation of such an IGBT is essentially different from that of a related IGBT. In this case, the $p^+$-base region 27 is not operated as a collector of a BJT Thus, an equivalent circuit model of a related IGBT is not valid in which a MOSFET and a BJT are combined. An equivalent circuit of the IGBT such as above is expressed as a circuit in which a MOSFET and a p-i-n diode are combined.

The above-explained structure of the IGBT has a design advantage of requiring no extreme miniaturization. The cathode region is electrically isolated from the drift layer by the oxide film 21 except that the region is connected to the drift region only at a section without the oxide film 21, i.e., at the opening or window in the oxide film 21. Thus, the design dimension of the cathode region makes no direct contribution to the characteristics of the drift layer. This is in contrast to the related planar or trench IGBT where the whole cathode region is directly connected to the drift region, so that its design dimension is directly related to the device characteristics. Therefore, in the first embodiment, the characteristics of the tradeoff are unchanged without particular miniaturization of the $n^+$-source region 26.

Figure 5:
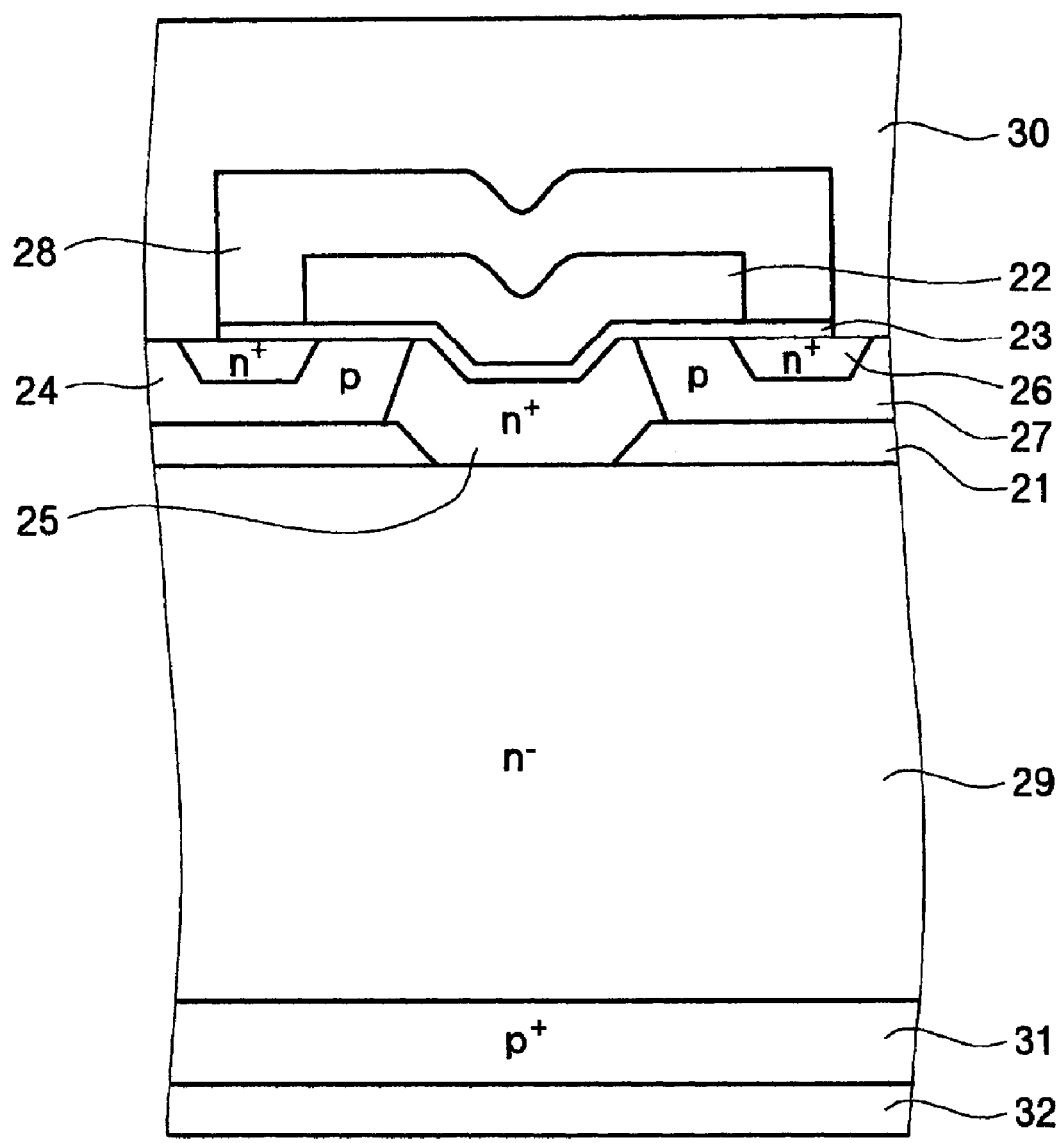
FIG. 5 schematically illustrates a cross sectional view of an IGBT according to the second embodiment.

FIG. 5 schematically illustrate a cross sectional view of an IGBT according to the second embodiment. As is shown in FIG. 5, the second embodiment 2 differs from the first embodiment as follows. The first difference is that, in the second embodiment, the surface of the oxide film 21 as the first insulator film and the section of the $n^-$-single crystal silicon substrate 29 covered with no oxide film 21 are covered with the cathode film 24. The second difference is that, in the second embodiment, on the surface of the cathode film 24, the gate oxide film 23 is formed, on which the gate polysilicon 22 is provided. The third difference is that, in the second embodiment, on the gate polysilicon 22, the interlayer insulator film 28 is provided, by which the gate polysilicon 22 is isolated from the emitter electrode 30. The fourth difference is that, in the second embodiment, the emitter electrode 30 is in contact with the $n^+$-source region 26 and the p-base region 27 through a contact hole penetrating the interlayer insulator film 28 and the gate oxide film 23.

In the second embodiment, in the cathode film 24, the $n^+$-buffer region 25 is a section in contact with the $n^-$-single crystal silicon substrate 29, and the p-base region 27 is provided on the oxide film 21 on the outside the opening or window of the oxide film 21. The $n^+$-source region 26 is provided in the surface region inside the p-base region 27. The arrangements other than the above are the same as those in the first embodiment. Like in the first embodiment, an $n^+$-buffer layer with a high impurity concentration as the third semiconductor region of the first conductivity type can be provided between the drift layer 29 and the $p^+$-anode region 31. Moreover, the operation and the advantage of the second embodiment are also the same as those of the first embodiment.

In the second embodiment, with the electric potential of the gate electrode (the gate polysilicon 22) made positive to the cathode, electrons are induced in a region around the interface of the p-base region 27 with the gate oxide film 23 to form a channel. The electrons pass through the channel to enter the $n^+$-buffer region 25. On the surface of the $n^+$-buffer region 25, an electron accumulation layer with a significantly high concentration is formed. Thus, most part of the electron current flows through the electron accumulation layer. The electrons, on entering the drift layer (the $n^-$-single crystal silicon substrate 29), are injected into the p⁺-anode layer 31 by drift under an electric field. The electrons injected into the p⁺-anode layer 31 move up to the anode electrode 32 by diffusion.

With the junction between the n⁻-drift layer and the p⁺-anode layer 31 being forward-biased, holes are injected from the anode and move in the n⁻-drift layer 29 by drift under the electric field to enter the n⁺-buffer region 25. Most part of the holes, due to their short diffusion lengths, disappear in the n⁺-buffer region 25 and the electron accumulation layer in the n⁺-buffer region 25 by the recombination with electrons. With the junction formed by the electron accumulation layer and the n⁻-drift layer being forward-biased, electron injection from the electron accumulation layer is accelerated (IE effect). This increases the carrier concentration on the cathode side to provide the on-voltage to switching loss tradeoff that is acceptable.

Figure 6:
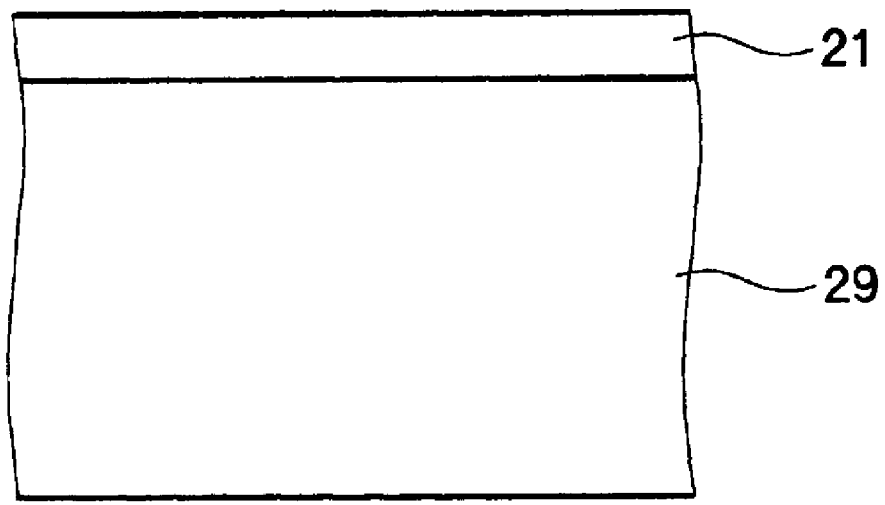
FIG. 6 schematically illustrates a cross sectional view for explaining a manufacturing method of an IGBT according to the third embodiment, where an oxide film is grown on a single crystal silicon substrate.
Figure 7:
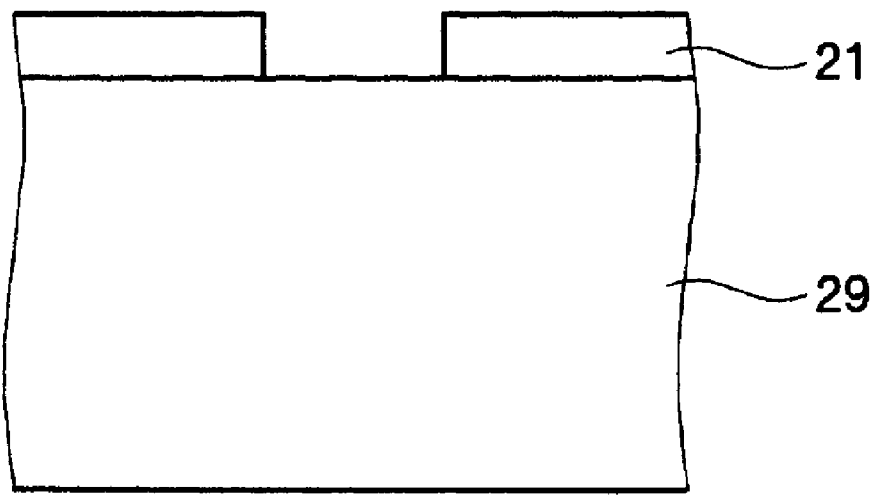

FIGS. 6-13 schematically illustrate cross sectional views for explaining the manufacturing method of the third embodiment. Although not particularly limited, the third embodiment will be explained regarding manufacturing a non-punch-through type IGBT with a rate breakdown voltage of 600V to which the structure according to the second embodiment is applied. First, for the n⁻-single crystal silicon substrate 29, an n-type FZ silicon substrate with a resistivity of 30 Ωcm, for example, is prepared. Then, by thermal oxidation the oxide film 21 with a thickness of 0.1 μm, for example, is formed, namely grown on the mirror-polished surface of the substrate (FIG. 6). Next, part of the oxide film 21 is removed by carrying out patterning and etching of the oxide film 21 (FIG. 7).

Figure 8:
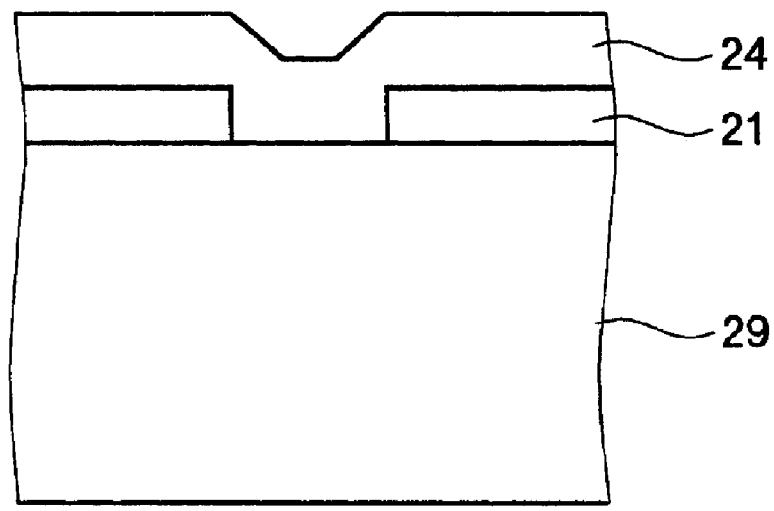

Thereafter, on the oxide film 21 and part of the n-single crystal silicon substrate 29 exposed in the opening of the oxide film 21, polysilicon is deposited to a thickness of 0.25 cm, for example. The polysilicon is doped with an n-type, with the impurity concentration of $1\times10^{16}$ cm$^{-3}$, for example. The polysilicon is to be the cathode film 24, which later becomes the source region, the channel region, and the buffer region (FIG. 8). Then, thermal oxidation is carried out to oxidize the surface of the cathode film 24, by which the gate oxide film 23 with a thickness of 0.1 μm, for example, is formed. At this time, the thickness of the polysilicon film is reduced by about 0.05 μm, for example. Thus, the thickness of the cathode film 24 becomes 0.2 μm, for example.

Figure 9:
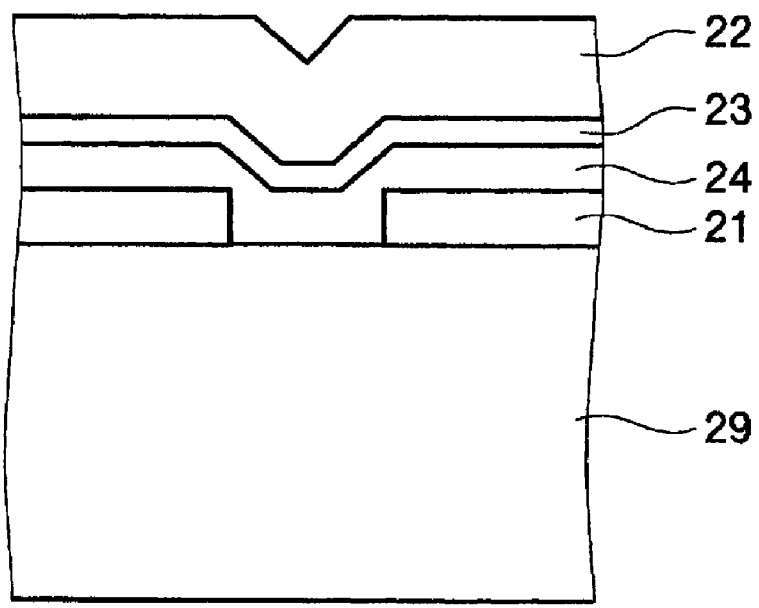

Next, on the gate oxide film 23, gate polysilicon 22 as a gate electrode is deposited to a thickness of 0.5 μm, for example. Then, heat treatment at 900° C. is carried out in a POCl₃ atmosphere to dope the gate polysilicon 22 with the n-type of high impurity concentration (FIG. 9). Thereafter, part of the gate polysilicon 22 is removed by carrying out patterning and etching of the gate polysilicon 22. With the rest of the gate polysilicon 22 used as a mask, boron ions with a dose of $5\times10^{14}$ cm$^{-2}$, for example, and arsenic ions with a dose of $1\times10^{15}$ cm$^{-2}$, for example, are implanted into the cathode film 24. Then, driving is carried out at 1150° C. for two hours in a nitrogen atmosphere to form the p-base region 27 to be a channel region and the n⁺-source region 26 (FIG. 10).

Figure 12:
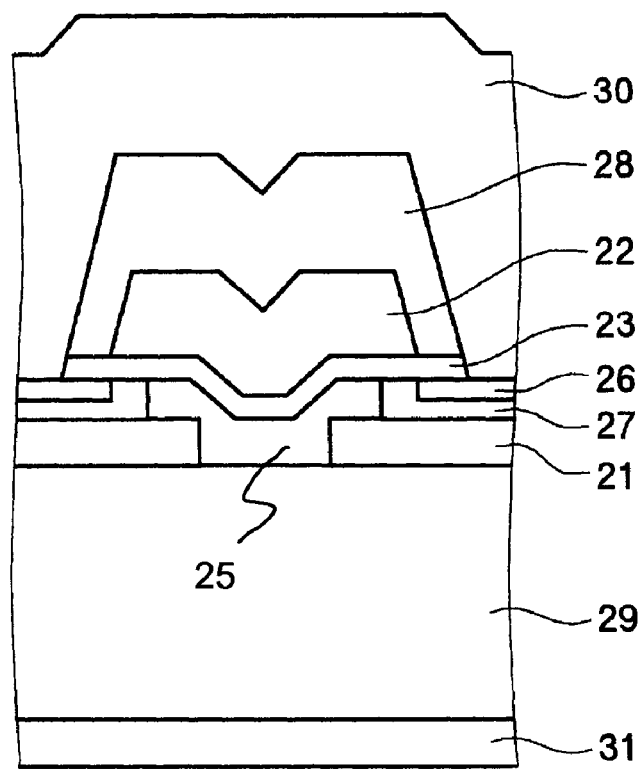

Next, for the interlayer insulator film 28, BPSG is deposited with a thickness of 1 μm, for example. Then, patterning and etching are carried out to form a contact hole penetrating the interlayer insulator film 28 and the gate oxide film 23. Thereafter, a metal such as aluminum is sputtered on the interlayer insulator film 28 to a thickness of 5 μm, for example. Then, patterning and etching of the metal such as aluminum is carried out to form the emitter electrode 30 (FIG. 11). Next, the bottom surface of the n⁻-single crystal silicon substrate 29 is ground, by which the wafer thickness is brought to 100 cm, for example. Thereafter, into the ground surface, boron ions are implanted with a dose of $1\times10^{14}$ cm$^{-2}$, for example. Then, annealing is carried out at 380° C. for one hour, for example, by which the p⁺-anode layer 31 is formed (FIG. 12).

Figure 13:
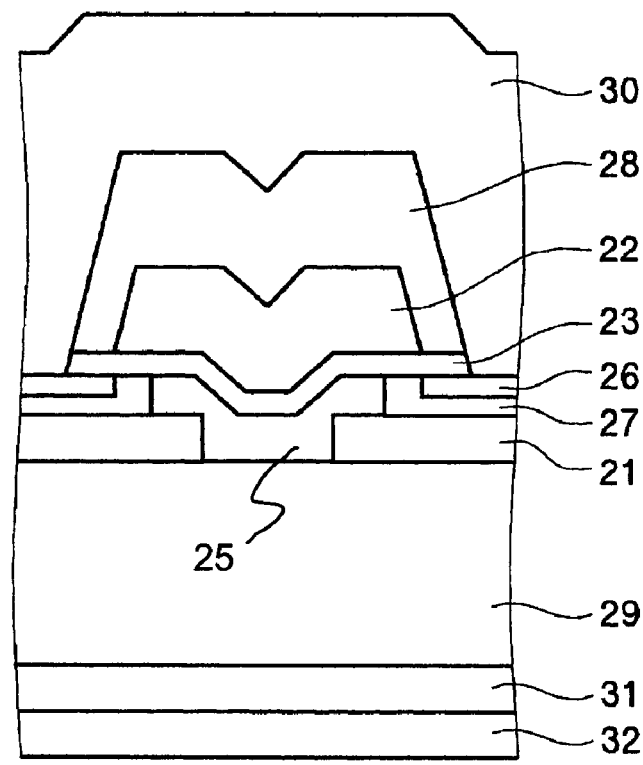

Next, a metal such as aluminum is evaporated on the surface of the p⁺-anode layer 31, by which the anode electrode 32 is formed (FIG. 13). Before carrying out annealing, n-type impurity ions, such as phosphorus ions, can be implanted on the ground surface of the bottom side of the n-single crystal silicon substrate 29. This allows, between the n⁺-drift layer and the p⁺-anode layer 31, the n⁺-buffer layer to be formed together with the p⁺-anode layer 31 by carrying out annealing. Finally, the wafer is subjected to dicing, by which a chip is completed.

FIGS. 14-21 schematically illustrate cross sectional views for explaining the manufacturing method of the fourth embodiment. Although the fourth embodiment is explained regarding manufacturing a field-stop type IGBT with a rated breakdown voltage of 1200V to which the structure according to the first embodiment is applied, the present invention is not limited thereto. In the fourth embodiment, however, between the drift layer (the n-single crystal silicon substrate 29) and the p⁺-anode layer 31, an n⁺-buffer layer 33 with an impurity concentration higher than the impurity concentration in the drift layer is formed as a field-stop layer.

First, for the n⁻-single crystal silicon substrate 29, an n-type FZ silicon substrate with a resistivity of 80 Ωcm, for example, is prepared. Then, thermal oxidation is carried out to form the oxide film 21 with a thickness of 0.1 μm, for example, namely grown on the mirror-polished surface of the substrate. Subsequently, on the oxide film 21, the gate polysilicon 22 is deposited to a thickness of 0.5 cm, for example. Then, heat treatment at 900° C. is carried out in a POCl₃ atmosphere, for example, to dope the gate polysilicon 22 within the n-type with a high impurity concentration (FIG. 14).

Figure 16:
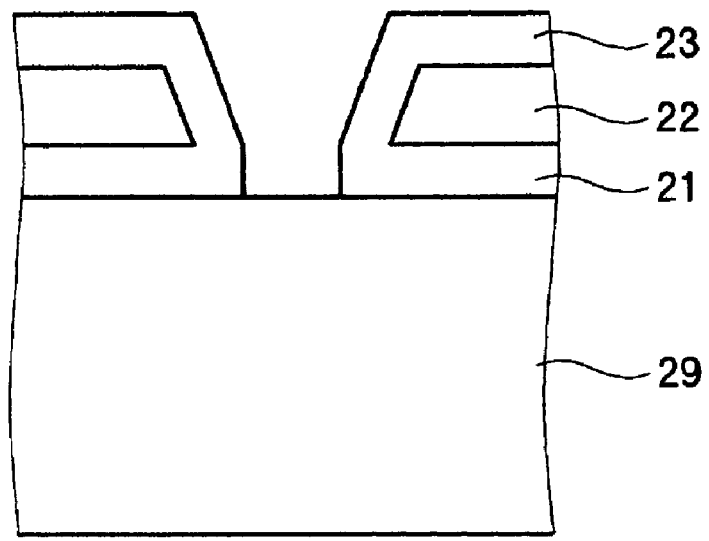
Figure 17:
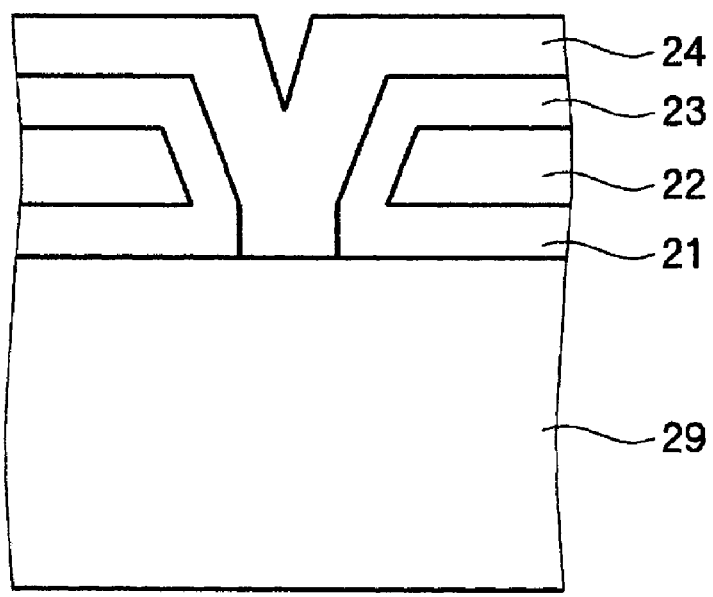

Thereafter, part of the gate polysilicon 22 is removed by carrying out patterning and etching of the gate polysilicon 22 (FIG. 15). Then, thermal oxidation is carried out to oxidize the surface of the polysilicon 22, by which the gate oxide film 23 with a thickness of 0.1 μm, for example, is formed. Next, part of the gate oxide film 23 and part of the oxide film 21, both parts formed in the section without the gate polysilicon 22, are removed by carrying out patterning and etching of the gate oxide film 23 and the oxide film 21 (FIG. 16). Then, on the exposed parts of the gate oxide film 23 and the n-single crystal silicon substrate 29, polysilicon doped in the n-type with an impurity concentration of $1\times10^{16}$ cm$^{-3}$, for example, is deposited to a thickness of 0.25 μm, for example (FIG. 17). The polysilicon is to be the cathode film 24, which later becomes the source region, the channel region, and the buffer region.

Next, with a patterned resist used as a mask, boron ions with a dose of $5\times10^{14}$ cm$^{-2}$, for example, and arsenic ions with a dose of $1\times10^{15}$ cm$^{-2}$, for example, are implanted into the cathode film 24. Then, after the resist is subjected to ashing, driving is carried out at 1150° C. for two hours in a nitrogen atmosphere to form the p-base region 27 to be a channel region and the n⁺-source region 26. At this time, the crystal grain size of the polysilicon (cathode film 24) is increased to recover the mobility of carriers (FIG. 18).

Next, for the interlayer insulator film 28, BPSG is deposited with a thickness of 1 μm, for example. Then, patterning and etching are carried out to form a contact hole penetrating the interlayer insulator film 28 (FIG. 19). Thereafter, a metal such as aluminum is sputtered on the interlayer insulator film 28 to a thickness of 5 µm, for example. Then, patterning and etching of the metal such as aluminum is carried out to form the emitter electrode 30. Next, the bottom surface of the n⁻-single crystal silicon substrate 29 is ground, by which the wafer thickness is brought to 140 µm, for example.

Figure 21:
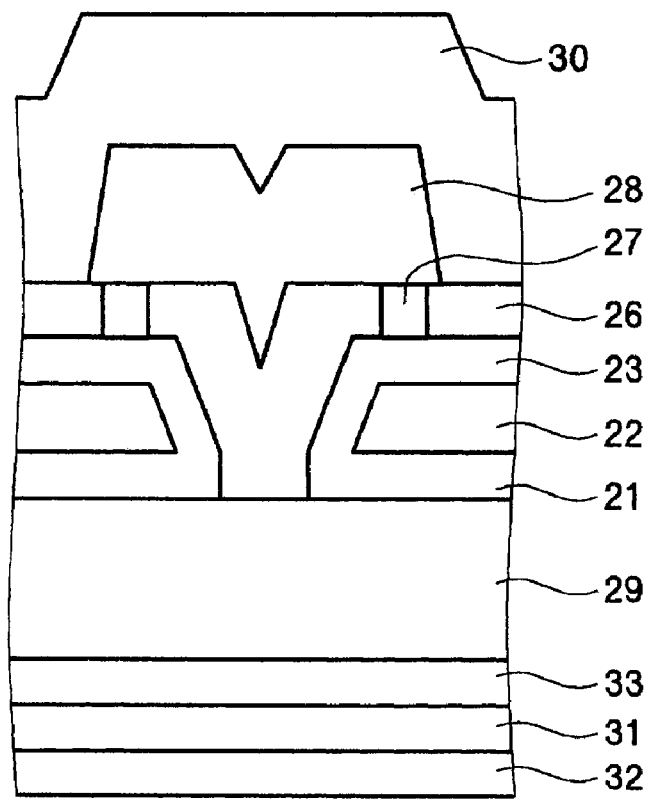

Thereafter, into the ground surface, phosphorus ions with a dose of $2 \times 10^{12}$ cm⁻², for example, and boron ions with a dose of $5 \times 10^{14}$ cm⁻², for example, are implanted. Then, annealing is carried out at 450° C. for five hours, for example, by which the n⁺-buffer layer 33 and the p⁺-anode layer 31 are formed. The n⁺-buffer layer 33 is formed at a position from the ground surface of the n⁻-single crystal silicon substrate 29 deeper than the position of the p⁺-anode layer 31 (FIG. 20). Next, a metal such as aluminum, titanium, nickel or gold is evaporated on the surface of the p⁺-anode layer 31, by which the anode electrode 32 is formed (FIG. 21). Finally, the wafer is subjected to dicing, by which a chip is completed.

Figure 22:
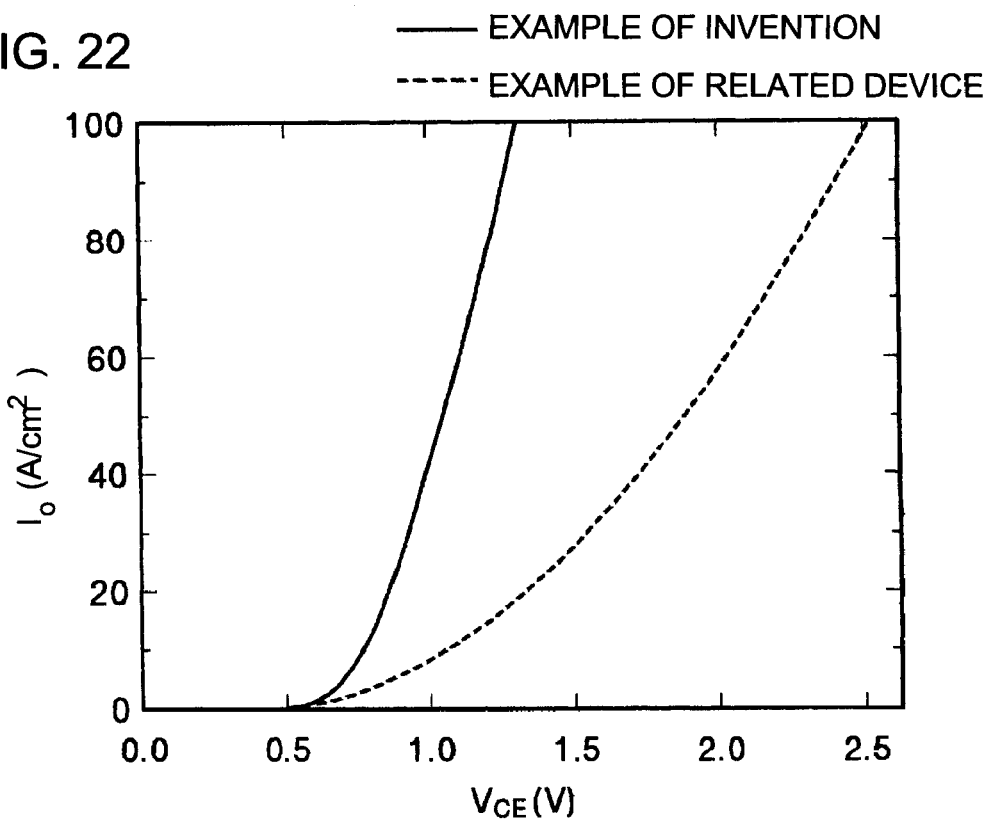
FIG. 22 is a characteristic diagram of an output characteristic of an IGBT of the fourth embodiment in comparison to an output characteristic of a related IGBT FIG. 23 schematically illustrates shares of an on-voltage in a steady on-state in the IGBT of the fourth embodiment.

FIG. 22 is a characteristic diagram showing an output characteristic of a field-stop type IGBT with a rated breakdown voltage of 1200V manufactured by the method according to the fourth embodiment (referred to as an example of the invention) and an output characteristic of a related field-stop type IGBT with a rated breakdown voltage of 1200V (referred to as an example of a related device), each at a temperature of 125° C. and a current density of 100 A/cm². As shown in FIG. 22, the on-voltage of the example of the invention was 1.3V. Compared with this, the on-voltage of the example of the related device was 2.5V. Thus, it confirms that the example of the invention has a lower on-voltage.

Figure 23:
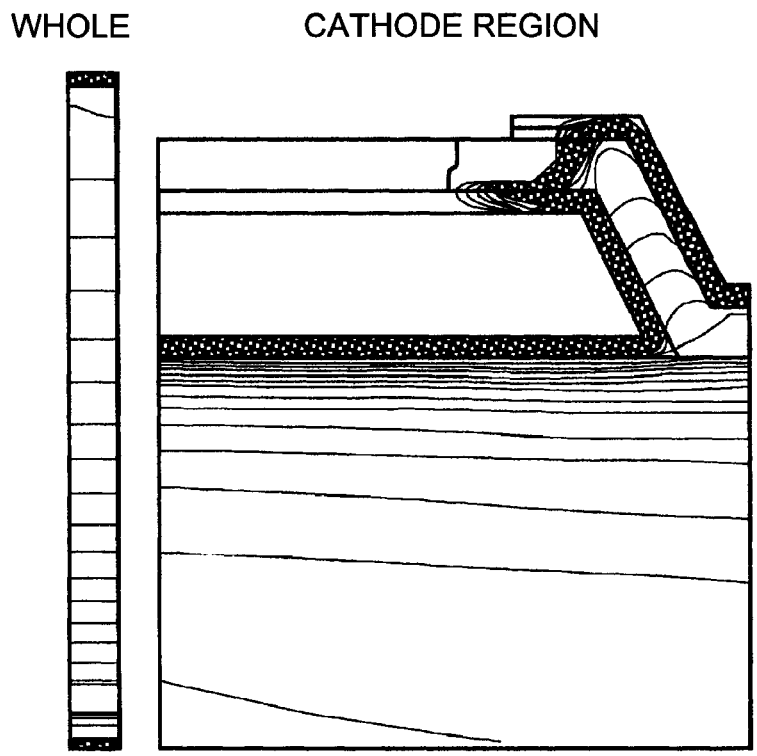

FIG. 23 shows shares of an on-voltage in a steady on-state in the field-stop type IGBT with a rated breakdown voltage of 1200V of the fourth embodiment. FIG. 23 shows the magnitude of the bias shared in each region in the device when 2V is applied between the collector and the emitter. Observation of the entire view of the device (a left-hand view in FIG. 23) shows that the distance between equipotential lines becomes wide on the surface side (the upper side of the view) where the carrier concentration is high because the electric resistance on the surface side is low. In comparison, on the bottom surface side (lower side of the view) where the carrier concentration is low, a high electric resistance narrows the distance between equipotential lines.

From the observation of an enlarged view of the cathode region in FIG. 23 (a right-hand view in FIG. 23), it is found that, in the cathode region (the polysilicon region in the cathode film 24) on the surface, the distance between equipotential lines is wide, that is, resistance is low despite the mobility of carriers being equal to or below ⅓ of the mobility of carriers in single crystal silicon. This is because most of current flows in the electron accumulation layer. Moreover, lifetimes of electrons and holes are 500 ps. The hole diffusion length in the polysilicon is of the order of 0.5 µm. Thus, many of the holes entering the cathode region disappear in the n⁺-buffer region 25 by recombination with electrons. Moreover, the hole current in the p-base region 27 is so small that there is no voltage drop in the p-base region as was observed in the related IGBT Therefore, the junction between the n⁺-source region 26 and the p-base region 27 is not forward-biased to cause no thyristor operation due to latchup. In other words, the device is latchup-free, so that enhancement is expected in short-circuit capability and in a reverse-bias safe operating area.

However, too short lifetime of holes in the cathode region lowers the hole current density in the n⁺-buffer region 25, which makes the voltage drop in the n⁺-buffer region 25 small. In this case, the amount of the forward bias at the junction between the electron accumulation layer and the n⁻-drift layer is reduced, by which electron injection from the cathode region is reduced. Therefore, the voltage drop, generated in the n⁺-buffer region 25 by securing a certain extent of hole current, better enhances the IE effect. This results in the optimized carrier distribution in the n-drift layer, by which the voltage drop in the n⁺-buffer region 25 is canceled.

Figure 24:
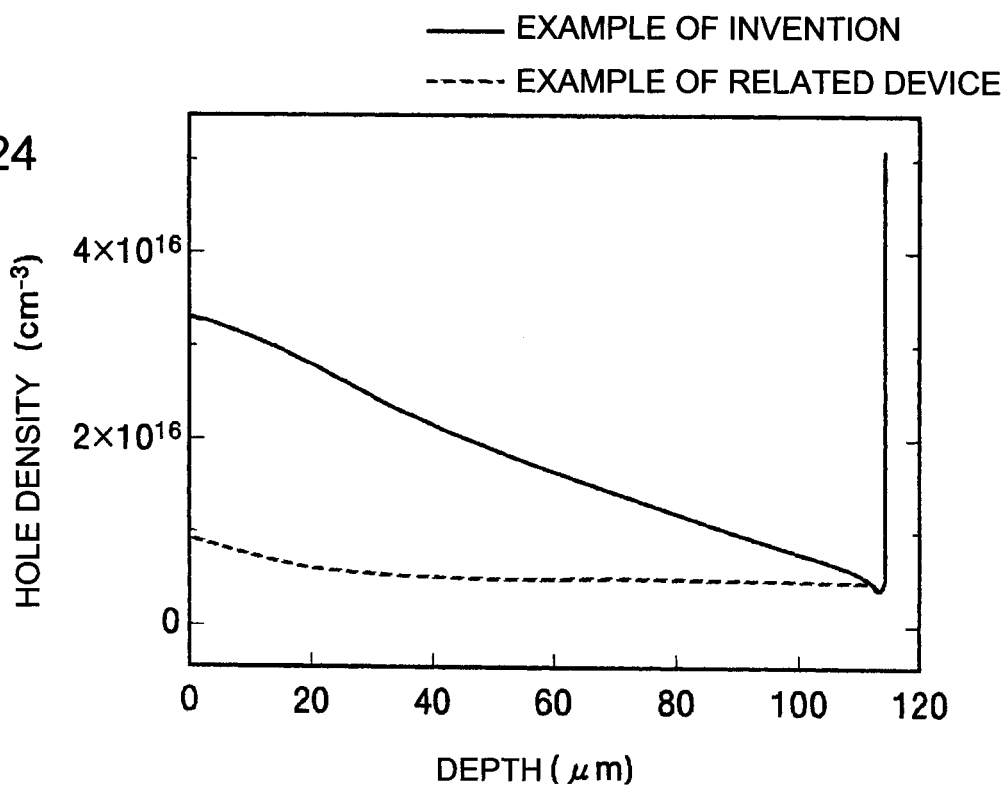
FIG. 24 is a characteristic diagram of a vertical distribution of excessive carriers in an on-state of each of the IGBT of the fourth embodiment and a related IGBT.
Figure 25:
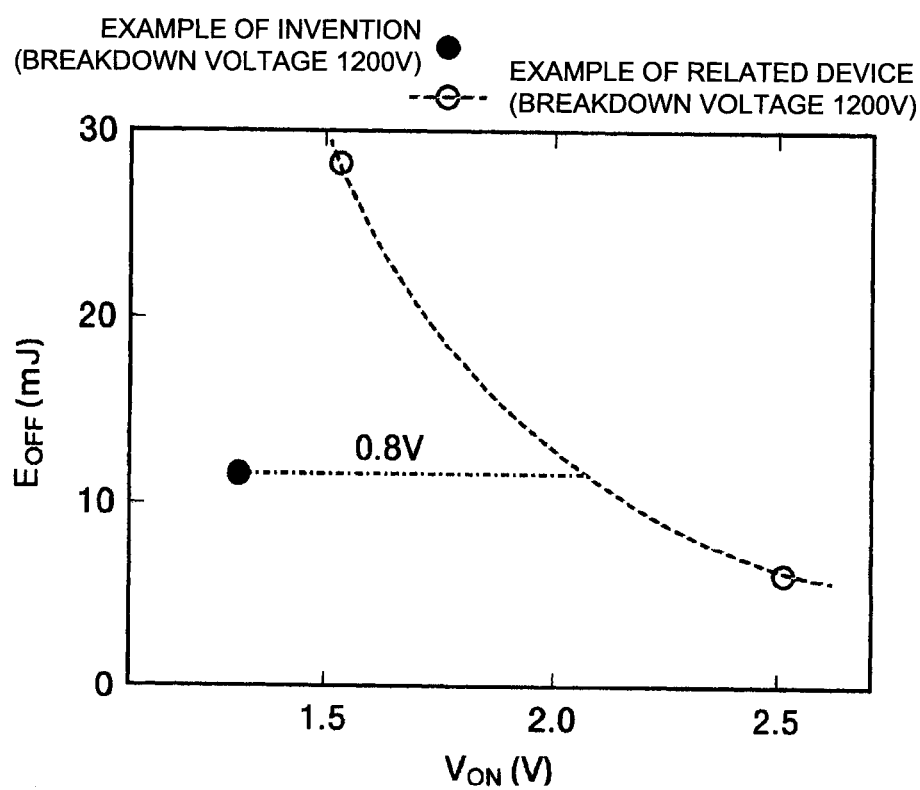
FIG. 25 is a characteristic diagram of an on-voltage to turn-off loss tradeoff of each of the IGBT of the fourth embodiment and a related IGBT.

FIG. 24 is a characteristic diagram showing a vertical distribution of excessive carriers in the on-state of each of the field-stop type IGBT with a rated breakdown voltage of 1200V of the fourth embodiment (referred to as an example of the invention) and a related field-stop type IGBT with a rated breakdown voltage of 1200V (referred to as an example of a related device). As shown in FIG. 24, it was ascertained that, in the example of the invention, the cathode side carrier concentration (on the left side of the diagram) becomes about five times the anode side carrier concentration (on the right side of the diagram), and an ideal carrier concentration distribution is provided. Moreover, FIG. 25 is a characteristic diagram showing the on-voltage to turn-off loss tradeoff of each of the field-stop type IGBT with the rated breakdown voltage of 1200V of the fourth embodiment (referred to as an example of the invention) and a related field-stop type IGBT with a rated breakdown voltage of 1200V (referred to as an example of a related device). In FIG. 25, $V_{ON}$ and $E_{OFF}$ represent the on-voltage and the turn-off loss, respectively. As shown in FIG. 25, it was ascertained that the turn-off loss $E_{OFF}$ in the example of the invention becomes significantly small for the on-voltage $V_{ON}$ as much as 0.8V lower than that of the example of a related device, and the tradeoff in the example of the invention has been largely improved as compared with that in the example of a related device.

Figure 26:
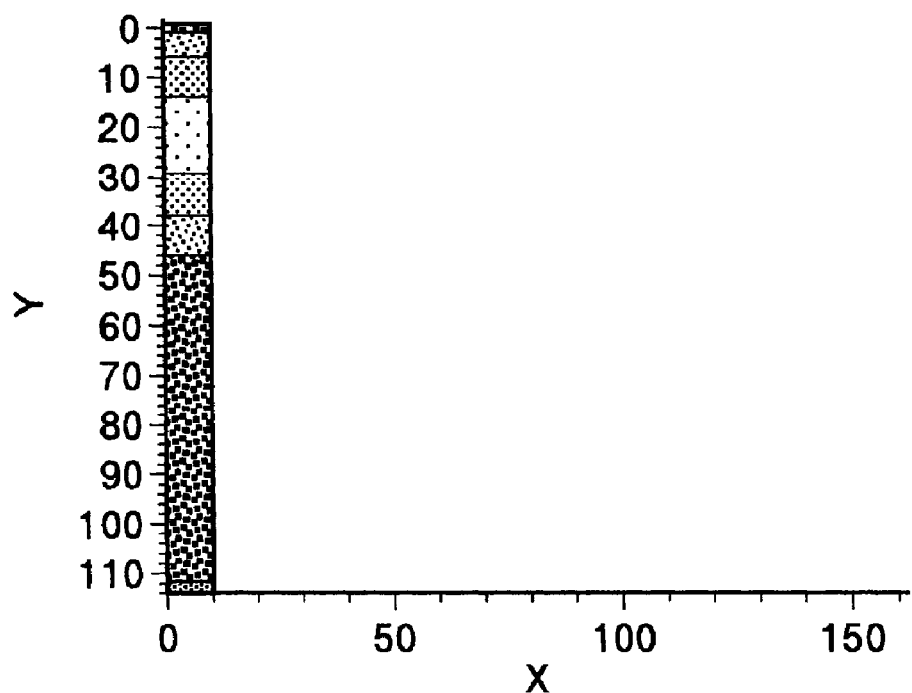
FIG. 26 is a diagram of an electric field distribution, represented by the density of dots, in the entire IGBT of the fourth embodiment when the IGBT is in a blocking mode.
Figure 27:
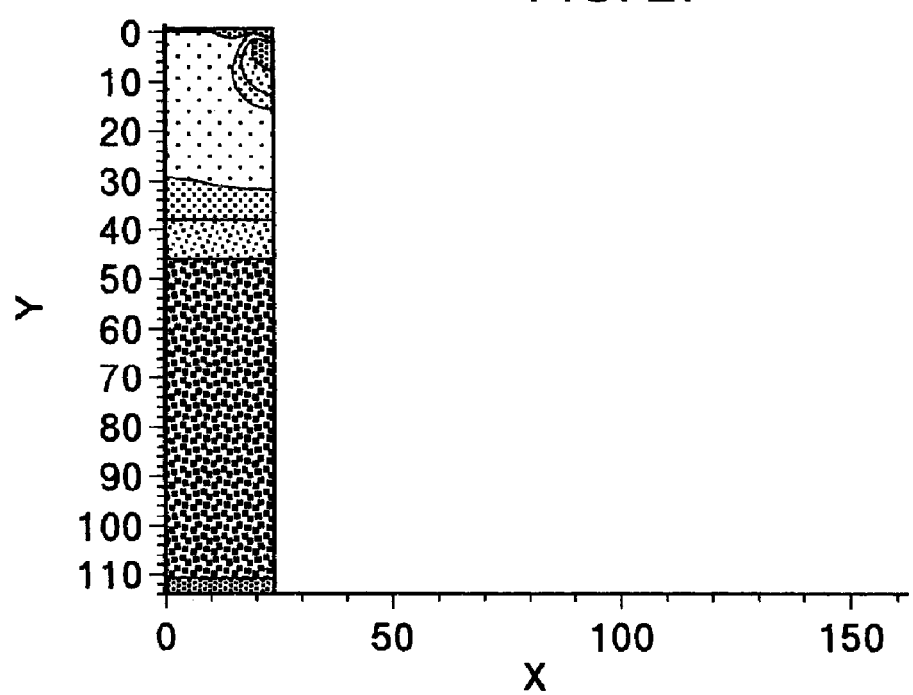
FIG. 27 is a diagram of an electric field distribution, represented by the density of dots, in the entire related IGBT when the IGBT is in a blocking mode.

FIG. 26 is a diagram showing an electric field distribution, represented by the density of dots, in the entire device when the field-stop type IGBT with the rated breakdown voltage of 1200V of the fourth embodiment (referred to as an example of the invention) is in a blocking mode. Moreover, FIG. 27 is a diagram showing an electric field distribution, represented by the density of dots, in the entire device when the related field-stop type IGBT with a rated breakdown voltage of 1200V (referred to as an example of a related device) is in a blocking mode. In each diagram, X and Y represent relative values of dimensions in the vertical and horizontal directions. The direction X indicates the width of one cell and Y direction indicates the depth (vertical direction of the substrate). The width direction (X), however, is different in FIGS. 26 and 27; the cell pitch in FIG. 26 set at one-half of that in FIG. 27. The lines (boundary of dots) extending substantially along the X or horizontal direction are the indicated electrical fields. There is only one electric field substantially between 0-30 (Y-direction) in FIG. 27, and corresponds to the portion of 14-29 (Y-direction) in FIG. 26.

From both diagrams, it is envisioned that the breakdown voltage in FIG. 26 is higher than that in FIG. 27 because there are more lines of electrical field in FIG. 26 than those in FIG. 27. The breakdown voltage of 1420V at a current of 1 mA of the example was measured, which voltage is improved as compared with the breakdown voltage of 1370V of the example of the related device. At the blocking mode of the example of the invention, the electric field distribution is averaged by which a numerical value near a one-dimensional ideal breakdown voltage is obtained.

Therefore, even with the thickness further made thinner, the breakdown voltage of the same order of that of the example of a related device can be obtained. As a matter of course, the on-voltage of the example of the invention is reduced. This means that the example of the invention has an excellent on-voltage to the breakdown voltage tradeoff.

Figure 28:
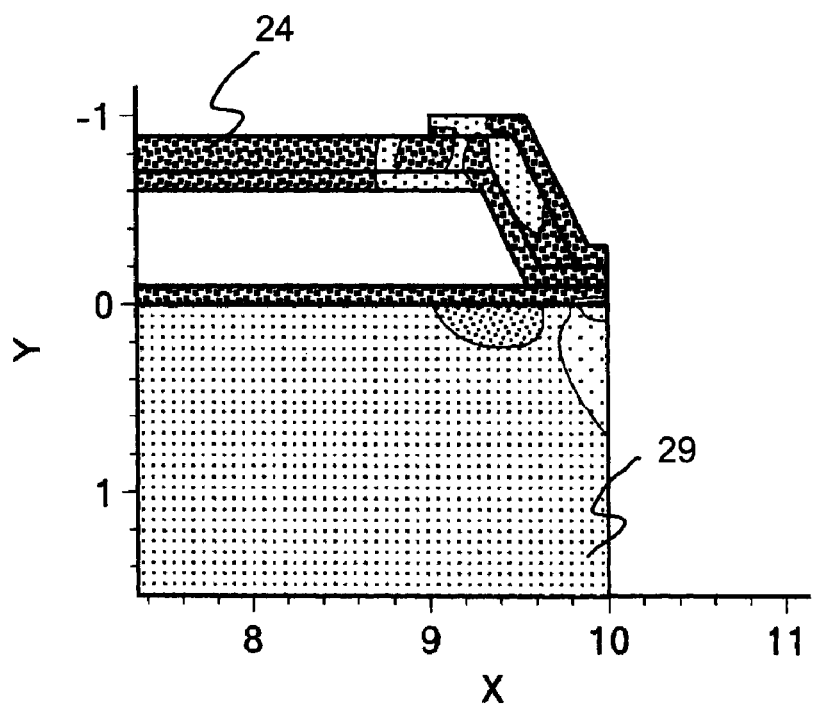
FIG. 28 is a diagram of an enlarged view of an electric field distribution, represented by the density of dots, around the cathode region of the IGBT of the fourth embodiment when the IGBT is in a blocking mode.

Moreover, FIG. 28 is a diagram showing an enlarged view of an electric field distribution around the cathode region when the field-stop type IGBT with the rated breakdown voltage of 1200V of the fourth embodiment is in a blocking mode. In the diagram, X and Y represent relative values of dimensions in the vertical and horizontal directions. From FIG. 28, it is known that the electric field becomes the maximum near the interface between the polysilicon (the cathode film 24) and the single crystal silicon (the n-single crystal silicon substrate 29).

FIGS. 29-33 schematically illustrate cross sectional views for explaining the manufacturing method of the fifth embodiment. Although the fifth embodiment is explained regarding manufacturing a reverse-blocking type IGBT with a rated breakdown voltage of 600V to which the structure according to the first embodiment is applied, the present invention is not limited thereto. In FIGS. 29-33, however, only the active section is shown (illustration of an isolation layer region being omitted). Furthermore, illustration of the process for forming the isolation layer region is also omitted.

First, for the n-single crystal silicon substrate 29, an n-type FZ silicon substrate with a resistivity of 30 Ωcm, for example, is prepared. Then, for forming the isolation layer region, thermal oxidation is carried out to form an oxide film with a thickness of 1.6 μm, for example, grown on the mirror-polished surface of the substrate. Thereafter, part of the oxide film is removed by patterning and etching the oxide film. Subsequently, a boron source is applied and driving is carried out at 1300° C. for 90 hours in an oxygen atmosphere to form the isolation layer region.

Next, thermal oxidation is carried out to grow the oxide film 21 to a thickness of 0.1 μm, for example. Subsequently, on the oxide film 21, the gate polysilicon 22 is deposited to a thickness of 0.5 μm, for example. Then, heat treatment at 900° C. is carried out in a POCl$_3$ atmosphere, for example, to dope the gate polysilicon 22 with the n-type with a high impurity concentration. Next, part of the gate polysilicon 22 is removed by patterning and etching the gate polysilicon 22. Then, thermal oxidation is carried out to oxidize the surface of the polysilicon 22, by which the gate oxide film 23 with a thickness of 0.1 μm, for example, is formed. Next, part of the gate oxide film 23 and part of the oxide film 21, both parts being formed in a section without the gate polysilicon 22, are removed by patterning and etching the gate oxide film 23 and the oxide film 21 (see FIGS. 14-16).

Figure 29:
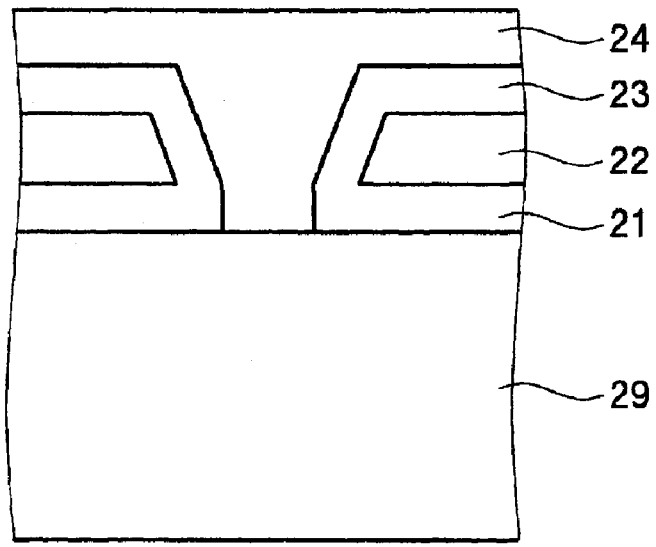
FIG. 29 schematically illustrates a cross sectional view for explaining a manufacturing method of an IGTB according to the fifth embodiment, where an oxide film, gate polysilicon, a gate oxide film, and a single crystal silicon layer are formed on a single crystal silicon substrate.

Next, from the opened section of the n-single crystal silicon substrate 29, a single crystal silicon layer including phosphorus with a concentration of $1 \times 10^{16}$ cm$^{-3}$, for example, is grown by the epitaxial growth. The epitaxial layer first grows upward from the opened section of the n$^-$-single crystal silicon substrate 29 without growth higher than the height of the gate oxide film 23. The epitaxial layer, on growing to more than the height of the upper surface of the gate oxide film 23, continues to grow upward and sideward. After a while, epitaxial layers grown from adjacent opened sections in the n$^-$-single crystal silicon substrate 29 come into contact with each other, by which the upper surface of the gate oxide film 23 is completely covered with the epitaxial layer. The epitaxially grown single crystal layer is to be the cathode film 24, which later becomes the source region, the channel region, and the buffer region (FIG. 29).

Next, boron ions with a dose of $1.5 \times 10^{14}$ cm$^{-2}$, for example, are implanted into the cathode film 24. Thereafter, with a patterned resist used as a mask, arsenic ions with a dose of $1 \times 10^{15}$ cm$^{-2}$, for example, are implanted into the cathode film 24. Then, after the resist is subjected to ashing, driving is carried out at 1150° C. for two hours in a nitrogen atmosphere to form the p-base region 27 as a channel region and the n$^+$-source region 26 (FIG. 30). Next, for the interlayer insulator film 28, BPSG is deposited with a thickness of 1 μm, for example. Then, patterning and etching are carried out to form a contact hole penetrating the interlayer insulator film 28 (FIG. 31).

Figure 32:
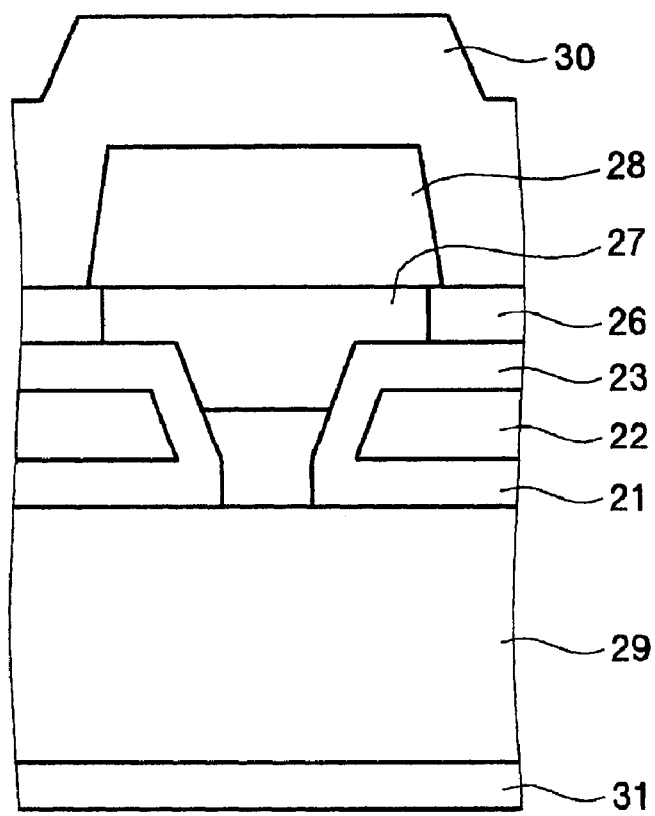
Figure 33:
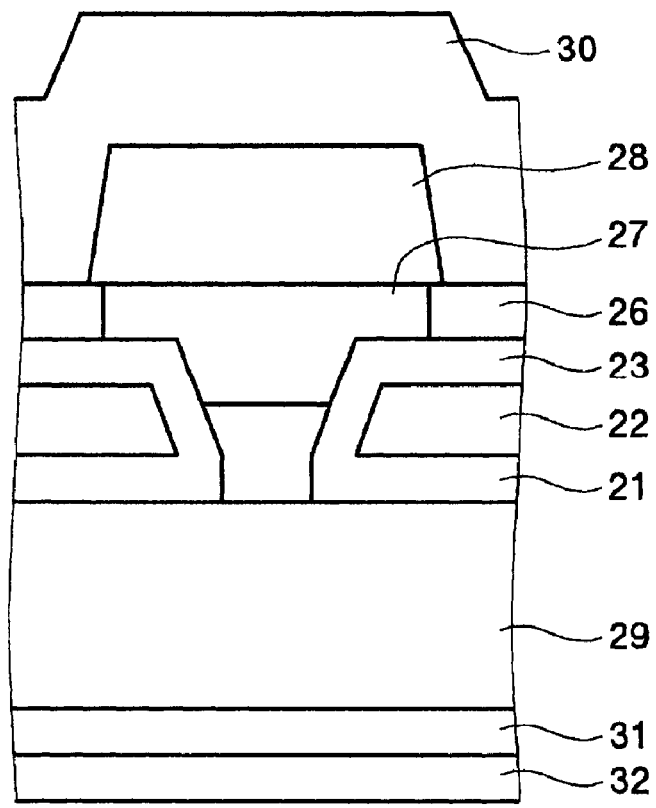

Next, a metal such as aluminum is sputtered on the interlayer insulator film 28 to a thickness of 5 μm, for example. Then, patterning and etching of the metal such as aluminum is carried out to form the emitter electrode 30. Next, the bottom surface of the n$^-$-single crystal silicon substrate 29 is ground, by which the wafer thickness is brought to 100 cm, for example. Thereafter, into the ground surface, boron ions with a dose of $1 \times 10^{14}$ cm$^{-2}$, for example, are implanted. Then, annealing is carried out at 380° C. for one hour, for example, by which the p$^+$-anode layer 31 is formed (FIG. 32). Next, a metal such as aluminum, titanium, nickel, or gold is evaporated onto the surface of the p$^+$-anode layer 31, by which the anode electrode 32 is formed (FIG. 33). Finally, the wafer is diced to complete the chip.

The reverse-blocking type IGBT manufactured by the method above for the fifth embodiment has an excellent on-voltage to turn-off loss tradeoff characteristic. Moreover, according to the reverse-blocking type IGBT manufactured by the method above, a reverse leak current in a reverse bias application mode characteristic to a reverse-blocking type IGBT is reduced as compared with a related reverse-blocking type IGBT. In the reverse-blocking type IGBT, injection of electron current, generated at the p-n junction on the bottom surface side, into the p-base region on the top surface side, makes the electron current become a base current of the p-n-p structure. This allows a large hole current to be injected from the p-base region on the top surface side by an amplification effect.

One of the important factors for determining the magnitude of the hole current to that of the electron current, that is, an amplification factor in the common-emitter connection, is the ratio of the amount of impurities in the p-base region to that in the n-drift layer. With a large value of the ratio, emitter efficiency is increased to increase the amplification factor. In a related reverse-blocking type IGBT with a rated breakdown voltage of 600V, the amount of impurities in the n-drift layer is on the order of $1.5 \times 10^{12}$ cm$^{-2}$. While, the amount of impurities in the p-base region is on the order of $1.5 \times 10^{14}$ cm$^{-2}$. Therefore, the ratio of the amount of impurities in the p-base region to that in the n-drift layer is 100:1.

In comparison, in the reverse-blocking type IGBT with a rated breakdown voltage of 600V manufactured by the method for the fifth embodiment, the ratio of the amount of impurities in the p-base region to that in the n-drift layer is on the order of 30:1. This is because the n$^+$-buffer region 25 with a high impurity concentration, provided in the IGBT according to the fifth embodiment, increases the total amount of n-type impurities to on the order of $5 \times 10^{12}$ cm$^{-2}$, although the amount of impurities in the p-base region 27 is $1.5 \times 10^{14}$ cm$^{-2}$, the same as the amount in the related reverse-blocking type IGBT, even in the IGBT according to the fifth embodiment.

With the ratio of the amount of impurities in the p-base region to that in the n-drift layer made lower than the ratio in the related device, the emitter efficiency is reduced to ⅓ or below the efficiency in the related device. This lowers the amplification factor, by which a reverse leak current is reduced to ⅓ or below the reverse leak current in the related device. Moreover, reduction in the amplification factor in the p-n-p structure enables realization of enhancement in a reverse avalanche breakdown voltage.

FIGS. 34-41 schematically illustrate cross sectional views for explaining the manufacturing method of the sixth embodiment. Although the sixth embodiment is explained regarding manufacturing a field-stop type IGBT with a rated breakdown voltage of 600V to which the structure according to the second embodiment is applied, the present invention is not limited thereto. In the sixth embodiment, however, between the drift layer (the n-single crystal silicon substrate 29) and the p$^+$-anode layer 31, an n$^+$-buffer layer 33 with an impurity concentration higher than the impurity concentration in the drift layer is formed as a field-stop layer. Moreover, the oxide film 21 to be the first insulator film is formed at a specified depth from the surface of the n-single crystal silicon substrate 29 (the first principal surface). Between the oxide film 21 and the surface of the n$^-$-single crystal silicon substrate 29, the n$^+$-source region 26 and the p-base region 27 are formed.

First, for the n$^-$-single crystal silicon substrate 29, an n-type FZ silicon substrate with a resistivity of 30 Ωcm, for example, is prepared. Then, thermal oxidation is carried out to form an oxide film 34 with a thickness of 1 μm, for example, grown on the mirror-polished surface of the substrate (FIG. 34). Next, part of the oxide film 34 is removed by patterning and etching the oxide film 34. With the rest of the oxide film 34 used as a mask, oxygen ions with a dose of 1×10$^{15}$ cm$^{-2}$ are implanted under an acceleration voltage of 100 kV, for example, into the n$^-$-single crystal silicon substrate 29 (FIG. 35). In FIG. 35, the hatched region 35 is the region into which the oxygen ions are implanted.

Next, annealing is carried out at 1300° C. to recover crystalline defects. As shown in FIG. 36, the oxide film 21 with a thickness of 0.1 μm, for example, is selectively formed under a single crystal silicon layer with a thickness of 0.3 μm, for example. The single crystal silicon layer with the thickness of 0.3 μm corresponds to the cathode film 24 in each of the first to fifth embodiments. After the oxide film 34 used as a mask is removed, thermal oxidation is carried out to oxidize the substrate surface, by which the gate oxide film 23 with a thickness of 0.1 μm, for example, is formed. At this time, the thickness of the single crystal silicon layer corresponding to the cathode film 24 is reduced by about 0.05 μm, for example. Thus, the thickness of the single crystal silicon layer becomes 0.25 μm, for example.

Subsequently, on the gate oxide film 23, the gate polysilicon 22 is deposited to a thickness of 0.5 μm, for example. Then, heat treatment at 900° C. is carried out in a POCl$_3$ atmosphere to dope the gate polysilicon 22 in the n-type of high impurity concentration (FIG. 36). Thereafter, part of the gate polysilicon 22 and part of the gate oxide film 23 are removed by patterning and etching the gate polysilicon 22 and the gate oxide film 23 (FIG. 37). With the rest of the gate polysilicon 22 used as a mask, boron ions with a dose of 5×10$^{14}$ cm$^{-2}$, for example, and arsenic ions with a dose of 1×10$^{15}$ cm$^{-2}$, for example, are implanted into the single crystal silicon layer corresponding to the cathode film 24. Then, driving is carried out at 1150° C. for two hours in a nitrogen atmosphere to form the p-base region 27 as a channel region and the n$^+$-source region 26 (FIG. 38).

Next, for the interlayer insulator film 28, BPSG is deposited with a thickness of 1 μm, for example. Then, patterning and etching are carried out to form a contact hole penetrating the interlayer insulator film 28 (FIG. 39). Thereafter, a metal such as aluminum is sputtered on the interlayer insulator film 28 to a thickness of 5 μm, for example. Then, patterning and etching of the metal, such as aluminum, is carried out to form the emitter electrode 30. Next, the bottom surface of the n$^-$-single crystal silicon substrate 29 is ground, by which the wafer thickness is brought to as 100 cm, for example.

Figure 40:
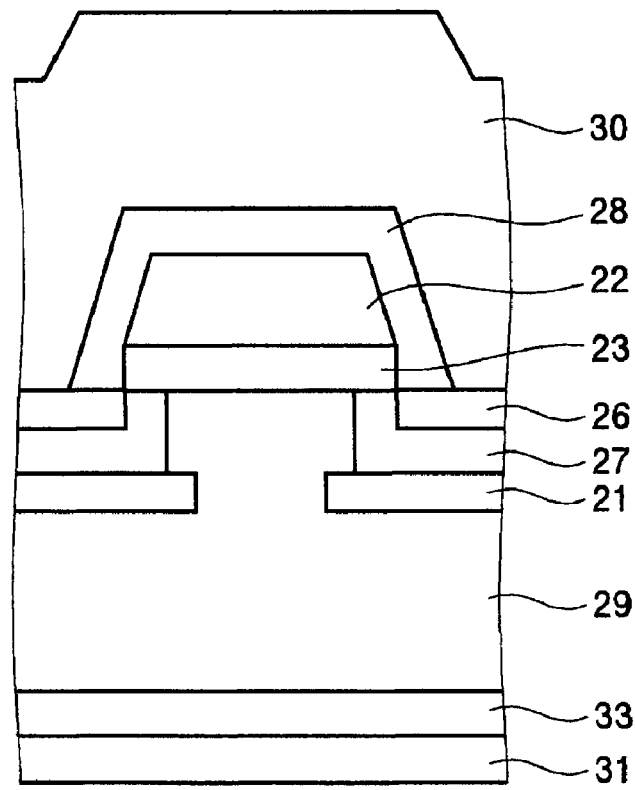
Figure 41:
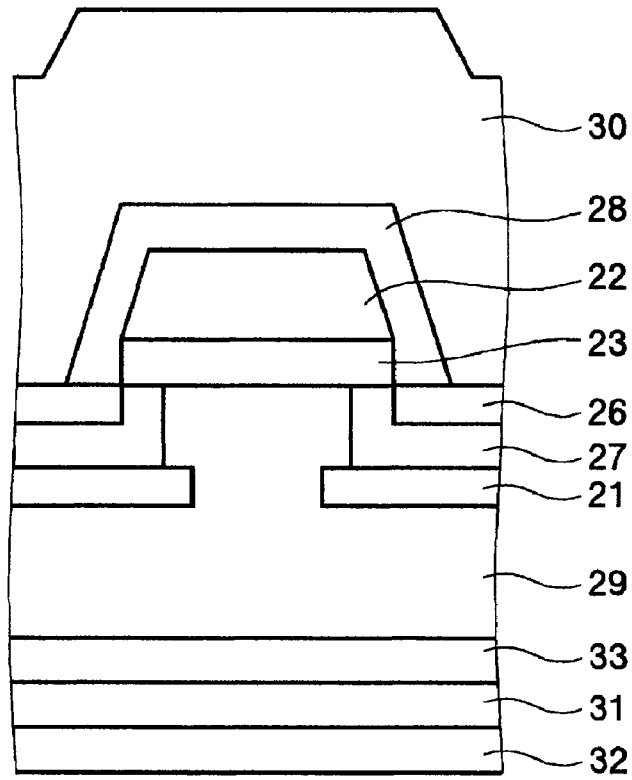

Next, into the ground surface, phosphorus ions with a dose of 2×10$^{12}$ cm$^{-2}$, for example, and boron ions with a dose of 5×10$^{14}$ cm$^{-2}$, for example, are implanted. Then, annealing is carried out at 1000° C. for five hours, for example, by which the n$^+$-buffer layer 33 and the p$^+$-anode layer 31 are formed. The n$^+$-buffer layer 33 is formed at a position from the ground surface of the n$^-$-single crystal silicon substrate 29 deeper than the position of the p$^+$-anode layer 31 (FIG. 40). Next, a metal such as aluminum, titanium, nickel, or gold is evaporated on the surface of the p$^+$-anode layer 31, by which the anode electrode 32 is formed (FIG. 41). Finally, the wafer is diced to complete the chip. With the IGBT manufactured by the method for the sixth embodiment, an advantage of small variation in characteristics and an advantage of small leak current are obtained.

Figure 42:
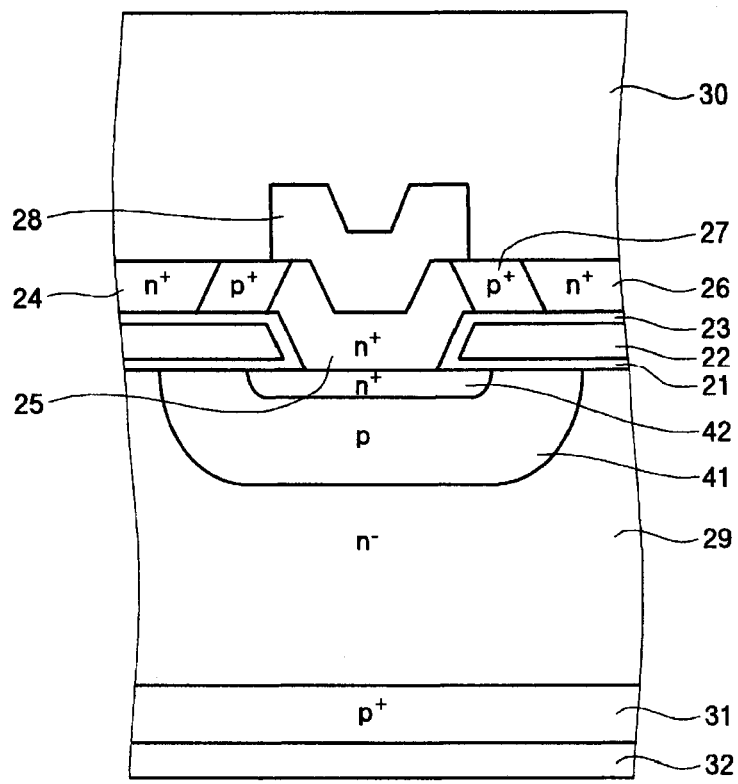
FIG. 42 schematically illustrates a cross sectional view of an arrangement of an IGBT according to the seventh embodiment.

FIG. 42 illustrate a cross sectional view of an IGBT according to the seventh embodiment. As is shown in FIG. 42, the seventh embodiment differs from the first embodiment in that a p-diffused layer 41 is provided in the section of the n$^-$-single crystal silicon substrate 29 with which section the n$^+$-buffer region 25 is in contact, and that an n$^+$-diffused layer 42 is provided in a section of the p-diffused layer 41 with which section the n$^+$-buffer region 25 is in contact. The n$^+$-diffused layer 42 extends to under the polysilicon 22. Namely, when the device is viewed from the emitter electrode 30 side, the periphery of the n$^+$-diffused layer 42 overlaps the gate polysilicon 22. The p-diffused layer 41 is independently provided in each cell so as to surround the n$^+$-diffused layer 42, but not contact the p-diffused layer 41 of the adjacent cell (not shown). The arrangements other than the above are the same as those in the first embodiment.

The p-diffused layer 41 and the n$^+$-diffused layer 42 are completely depleted when an applied voltage at forward voltage blocking is within a range of causing no avalanche breakdown in any part in the device. Next, the operation and the advantage of the seventh embodiment will be explained. This is in addition to those of the first embodiment.

A forward on-state, being brought with the gate potential made positive as compared with the emitter potential and with a forward bias applied between the collector and the emitter, allows electrons to flow from the emitter electrode 30 into the n$^+$-buffer region 25 through a channel formed in the p$^+$-base region 27. As explained above, in the seventh embodiment, since the p-diffused layer 41 and the n$^+$-diffused layer 42 are provided, electrons further flow from the n$^+$-buffer region 25 to the n$^+$-diffused layer 42.

Then, the electrons flow into the drift layer (the n-single crystal silicon substrate 29) through a channel formed with the surface of the p-diffused layer 41 inverted to the n-type and reach the p$^+$-anode layer 31 on the bottom surface (the second principal surface). This brings the p-n junction on the bottom surface, namely the junction between the p$^+$-anode layer 31 and the drift layer, to be forward-biased, by which holes are injected from the p$^+$-anode layer 31 to the drift layer. The holes injected into the drift layer are further injected into the n$^+$-diffused layer 42 through the p-diffused layer 41. This brings the p-n junction between the n$^+$-diffused layer 42 and the p-diffused layer 41 to be forward-biased, by which electrons are injected from the n+-diffused layer 42 to the p-diffused layer 41 to start a thyristor operation. At this time, the surface of the p-diffused layer 41 finishes the role of the channel. Namely, the channel on the surface of the p-diffused layer 41 is for turning on the thyristor. Once the thyristor operation is started, the p-diffusion layer 41 is brought into a high-injected state in which the carrier concentration is higher than the original doping concentration, so that the p-diffused layer 41 hardly affects the device characteristics.

At a forward-blocking mode, a forward bias still increased after the n+-buffer region 25 has been completely depleted causes the depletion layer to start extending also from the p-n junction between the p-diffused layer 41 and the drift layer (n-single crystal silicon substrate 29). At this time, most of the applied forward bias is held by the n-drift layer. Since the distance between the p-diffused layers 41 adjacent to each other is short, the extended depletion layers easily touch each other to cause pinch-off. This makes the section at the boundary of the depletion layer having a curvature of the p-n junction disappear, which can prevent the concentration of an electric field in the section having a curvature of the p-n junction as in a related device.

In a related planar IGBT, expansion of a collector region in a BJT degrades the IE effect. For preventing the degradation in the IE effect, the distance between the p-diffused layers 41 adjacent to each other must be designed wide. In comparison, in the seventh embodiment, the p-diffused layer 41, provided in the section in the n-single crystal silicon substrate 29 with which section the n+-buffer region 25 is in contact, is not the collector region of the BJT. Therefore, even though the p-diffused layer 41 is provided, the IE effect is not changed. This significantly enhances the breakdown voltage as compared with that of a related planar IGBT, and further improves the on-voltage to turn-off loss tradeoff.

An important point at the forward-blocking mode is that the n+-buffer region 25, functioning as the cathode when the thyristor is in a turned-on state, is completely depleted. This causes no thyristor operation at turning-off. Namely, with the n+-buffer region 25, the n+-diffused layer 42, the p-diffused layer 41, and the n-drift layer (the n-single crystal silicon substrate 29) depleted, whether the original conductivity types of their regions and layers are of the p-type or the n-type has no effect on the device characteristics.

In this way, the problem characteristic to a MOS thyristor element is eliminated in that a controllable current is low. At turning-off, with the channel in the p+-base region 27 disappearing rather than the channel on the surface of the p-diffused layer 41, the supply of current is cut off to start the turning-off operation.

Figure 43:
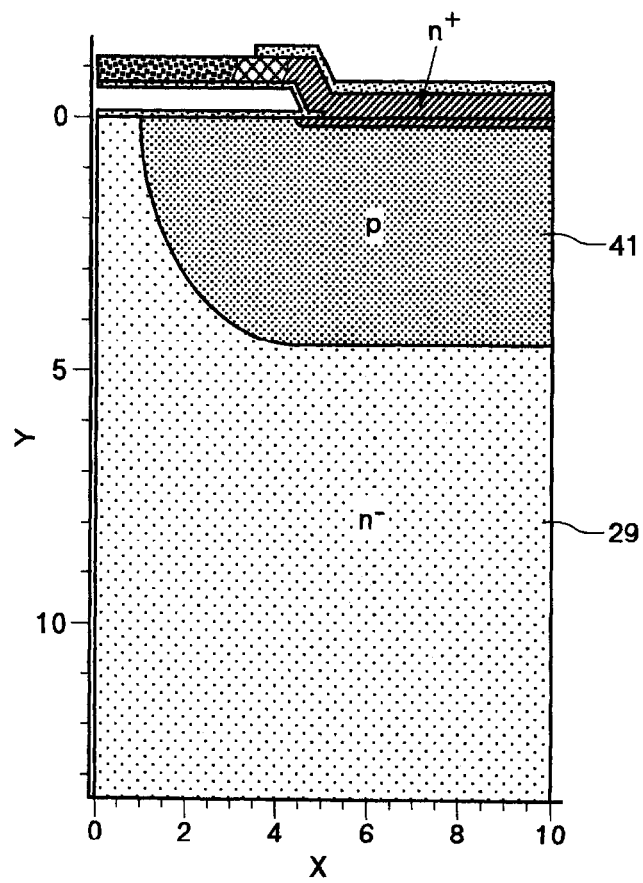
FIG. 43 is a diagram of a doping distribution, represented by the density of dots, in the IGBT of the seventh embodiment.
Figure 44:
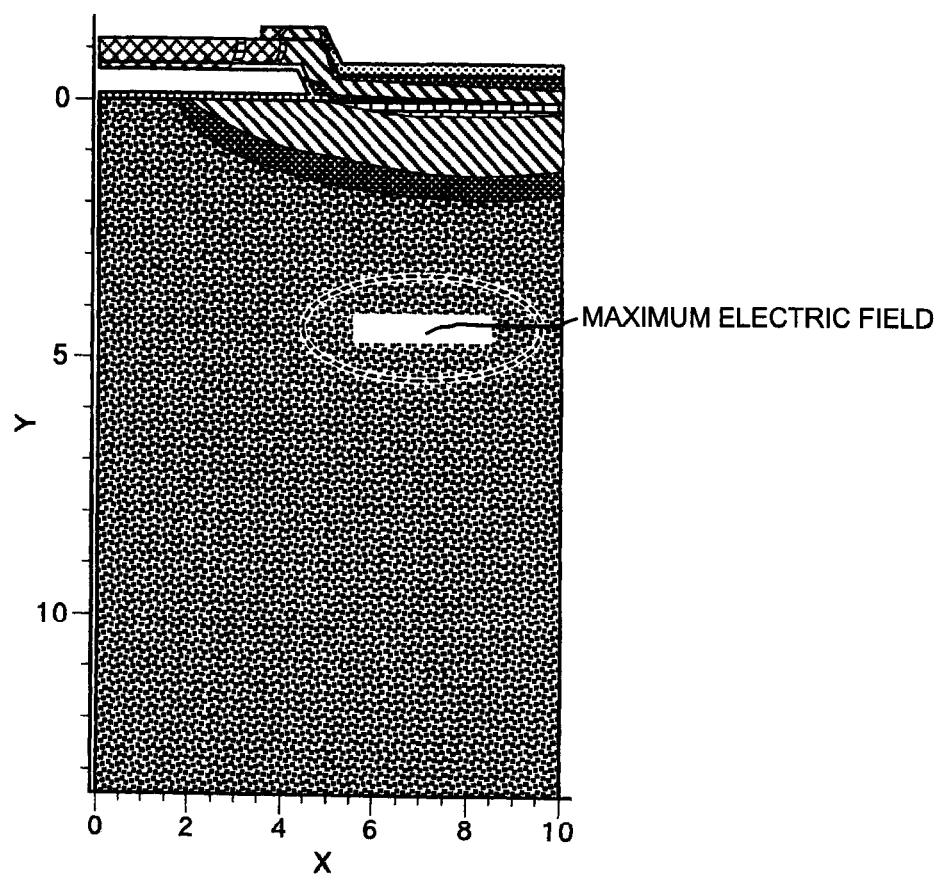
FIG. 44 is a diagram of an electric field distribution, represented by the density of dots, in the IGBT of the seventh embodiment when the IGBT is in a blocking mode.

FIG. 43 illustrates a diagram of a doping distribution in a field-stop type IGBT with a rated breakdown voltage of 1200V to which the arrangement according to the seventh embodiment is applied. FIG. 44 illustrates a diagram of an electric field distribution corresponding to the doping distribution shown in FIG. 43 when the IGBT is in a blocking mode. In each diagram, X and Y represent relative values of dimensions in the vertical and horizontal directions. As is apparent from the diagrams, the electric field strength becomes the maximum at the junction between the p-diffused layer 41 and the n−-drift layer (the n−-single crystal silicon substrate 29), and becomes weaker in the p-diffused layer 41 as the electric field is closer to the first principal layer. Therefore, the electric field strength in the cathode region becomes low to hardly cause an avalanche breakdown in the cathode region. The arrangement according to the seventh embodiment largely reduces the electric field strength in the cathode film 24. Therefore, when degradation in a breakdown voltage due to crystallinity in the cathode film 24 is feared, adoption of the arrangement according to the seventh embodiment allows one to obtain a breakdown voltage equivalent to an ideal breakdown voltage for a plane junction in a single crystal.

FIGS. 45-51 schematically illustrate cross sectional views for explaining the manufacturing method of the eighth embodiment. Although the eighth embodiment is explained regarding manufacturing a field-stop type IGBT with a rated breakdown voltage of 1200V to which the structure according to the seventh embodiment is applied, the present invention is not limited thereto. In the eighth embodiment, however, between the drift layer (the n-single crystal silicon substrate 29) and the p+-anode layer 31, the n+-buffer layer 33 with an impurity concentration higher than the impurity concentration in the drift layer is formed as a field-stop layer.

First, in the same way as in the method for the fourth embodiment, a laminated structure of the n-single crystal silicon substrate 29, the oxide film 21 and the n-type gate polysilicon 22 is formed (FIG. 14). For the n-single crystal silicon substrate 29, an n-type FZ silicon substrate with a resistivity of 80 Ωcm, for example, is used. The thickness of the oxide film 21 and the thickness of the gate polysilicon are the same as those in the fourth embodiment. Then, part of the gate polysilicon 22 is removed by patterning and etching the gate polysilicon 22.

Figure 45:
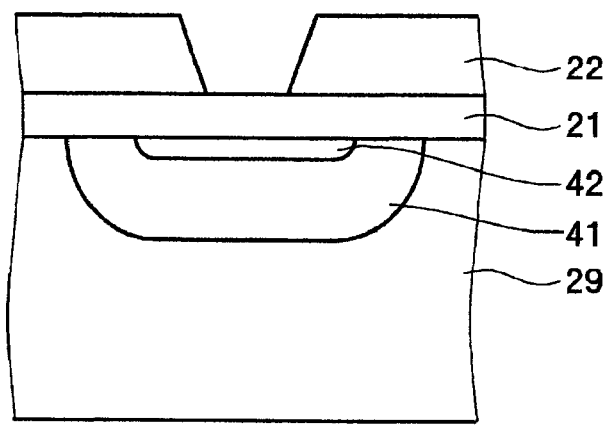
FIG. 45 schematically illustrates a cross sectional view for explaining a manufacturing method of an IGBT according to the eighth embodiment, where a p-diffused layer and an $n^+$-diffused layer are formed in a single crystal silicon substrate on which an oxide film and gate polysilicon are formed.
Figure 46:
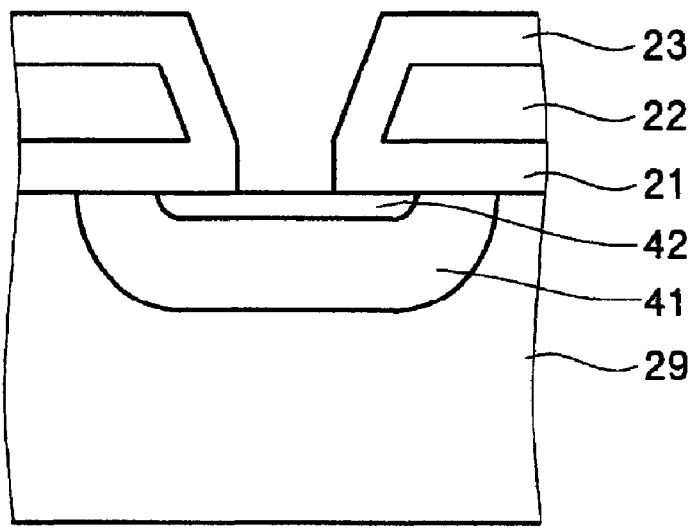
FIGS. 46-51 schematically illustrate cross sectional views for explaining the manufacturing method of the eighth embodiment, the steps following the step shown in FIG. 45.
Figure 47:
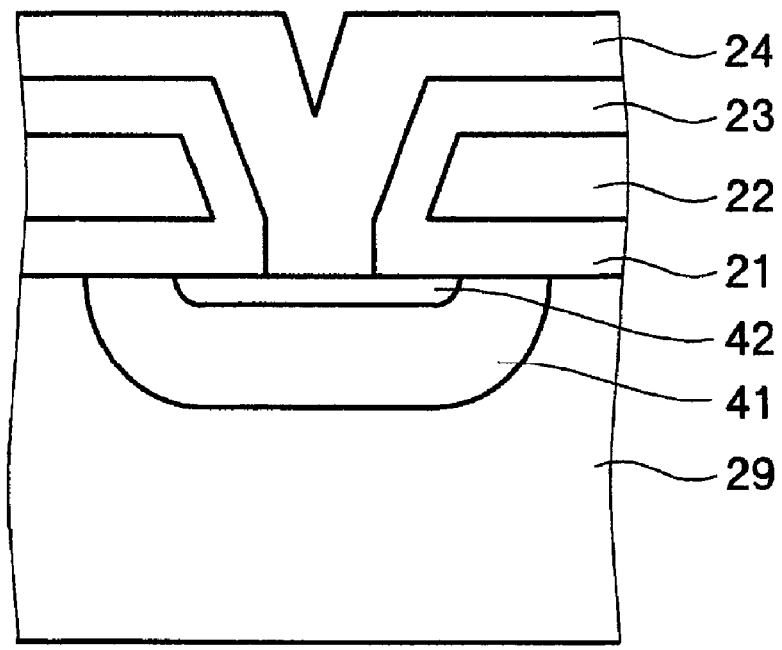
Figure 48:
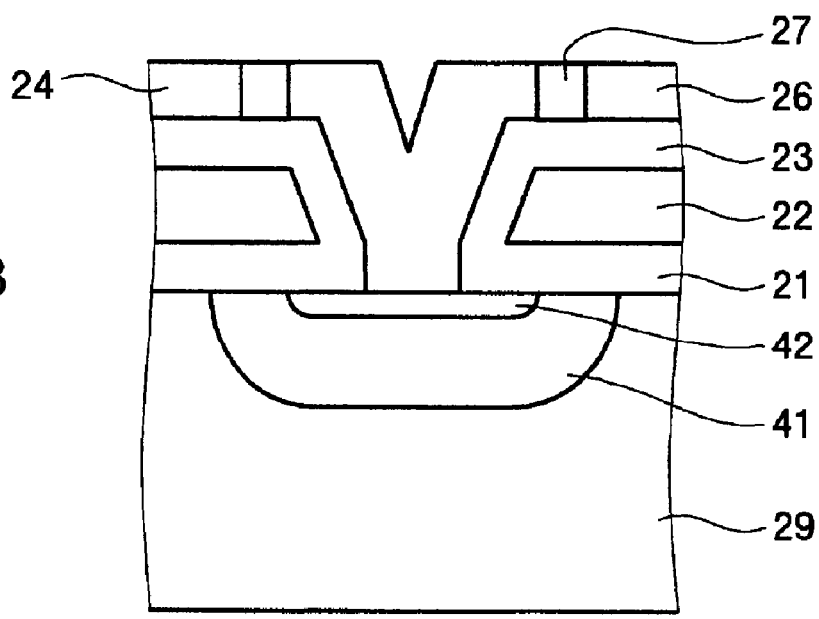
Figure 49:
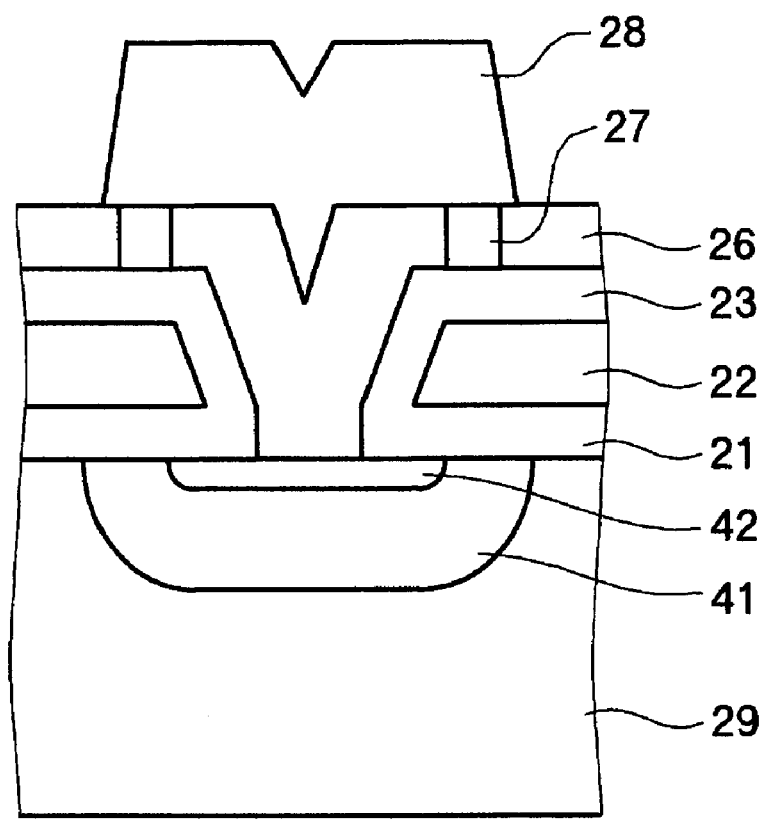
Figure 50:
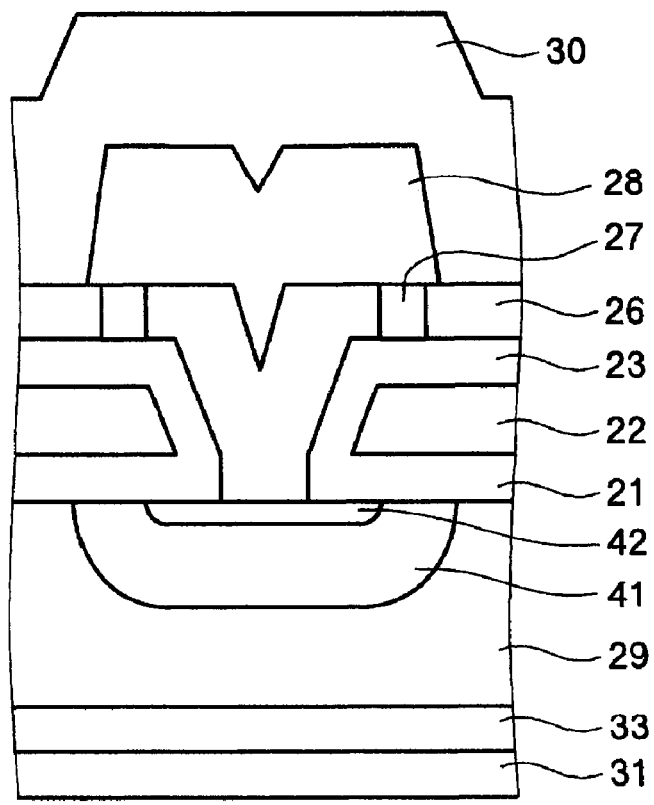
Figure 51:
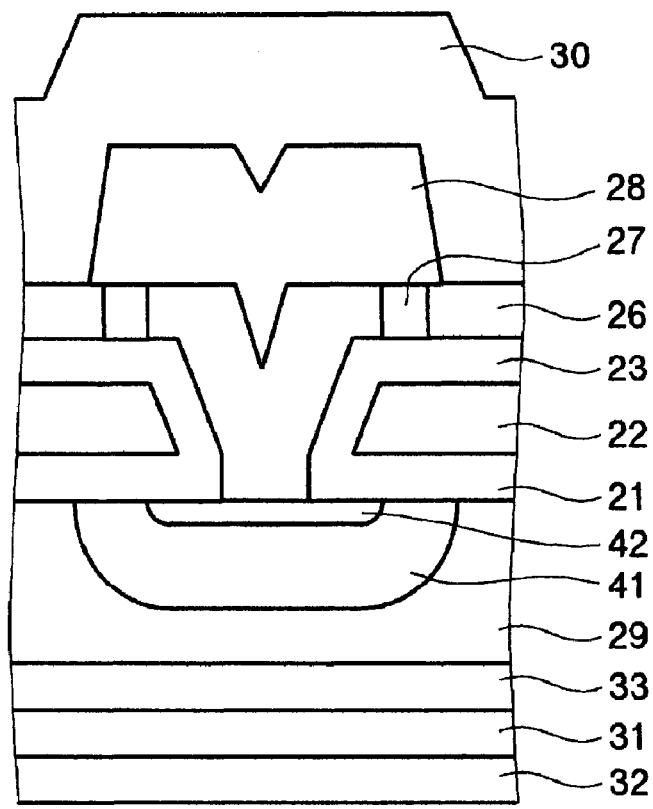

Next, with the gate polysilicon 22 used as a mask, boron ions with a dose of $1\times10^{12}$ cm$^{-2}$, for example, and arsenic ions with a dose of $1\times10^{12}$ cm$^{-2}$, for example, are implanted into the n−-single crystal silicon substrate 29 in self-alignment. Then, driving is carried out at 1150° C. for two hours in a nitrogen atmosphere to form the p-diffused layer 41 and the n+-diffused layer 42 on the first principal surface side of the n-single crystal silicon substrate 29 (FIG. 45).

The processes after this to the completion of the chip are the same as those in the fourth embodiment. Therefore, the explanations regarding the processes after this step is referred to the explanations given in the fourth embodiment, namely FIGS. 16-21 substituted by FIGS. 46-51, respectively.

Figure 52:
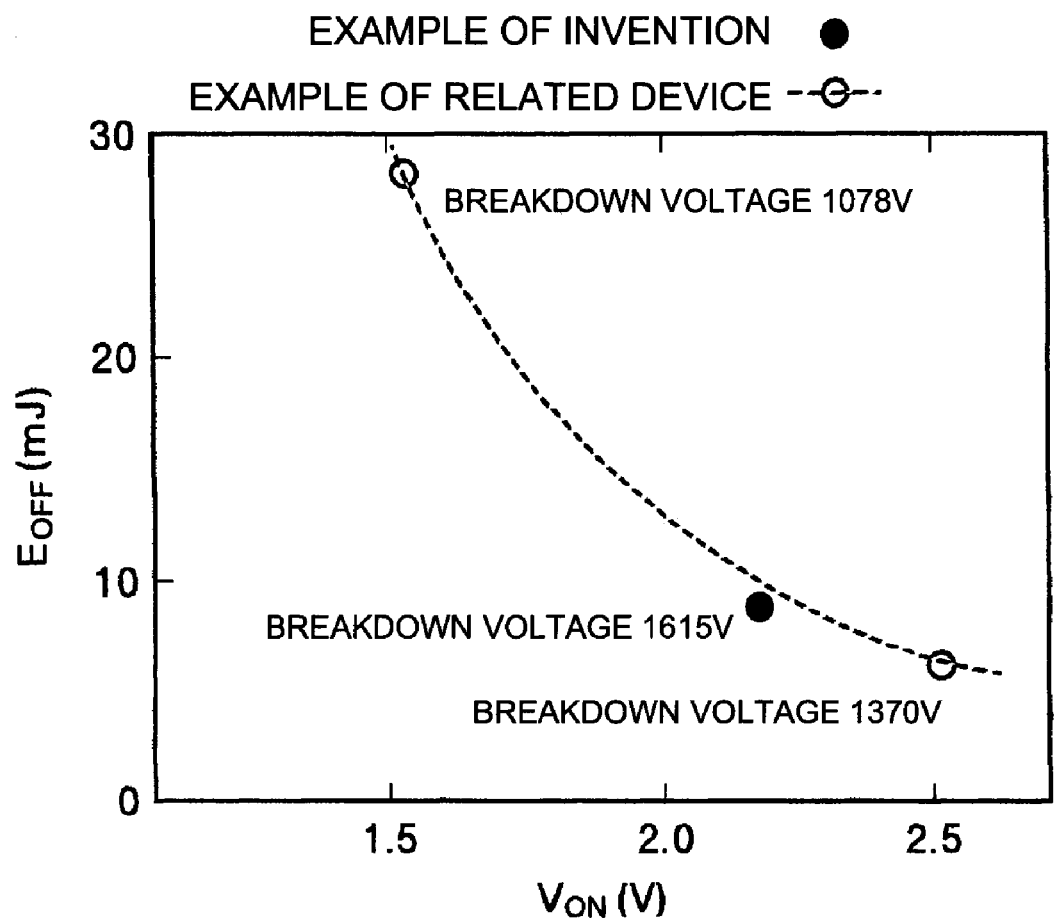
FIG. 52 is a characteristic diagram of an on-voltage to turn-off loss tradeoff of each of the IGBT of the eighth embodiment and a related IGBT.

FIG. 52 illustrates a characteristic diagram of an on-voltage to turn-off loss tradeoff at a temperature of 125° C. and a current density of 100 A/cm$^2$ of each of the field-stop type IGBT with the rated breakdown voltage of 1200V of the eighth embodiment (referred to as an example of the invention) and a related field-stop type IGBT with a rated breakdown voltage of 1200V (referred to as an example of a related device). In FIG. 52, $V_{ON}$ and $E_{OFF}$ represent the on-voltage and the turn-on loss, respectively. As shown in FIG. 52, it was ascertained that the tradeoff in the example of the invention is improved as compared with that in the example of a related device. Moreover, as compared with the breakdown voltage of 1078V to 1370V in the example of a related device, the breakdown voltage of the example of the invention is 1615V, by which it was ascertained that the breakdown voltage has been significantly (on the order of +250V to +500V) enhanced.

Illustration about the electric field distribution in a blocking mode of the field-stop type IGBT with a rated breakdown voltage of 1200V is given as shown in FIG. 44. The breakdown voltage at a current of 1 mA is 1615V. As shown in FIG. 44, the electric field intensity becomes the maximum at the junction between the p-diffused layer 41 and the n-drift layer (the n-single crystal silicon substrate 29). The electric field strength around the boundary face between the cathode film 24 and the single crystal silicon (the n⁺-diffused layer 42) is reduced by the presence of the p-diffused layer 41. Therefore, in the case where the cathode film 24 is made of polysilicon, even though impact ionization efficiency has been raised due to presence of polysilicon, this can be made to not much matter. Moreover, with the depletion layers between the adjacent p-diffused layer touching each other to cause pinch-off, the breakdown voltage can be obtained close to the ideal breakdown voltage of the one-dimensional plane junction.

As explained above, according to the present embodiments, the carrier distribution in the drift layer made of the n-single crystal silicon substrate 29 is formed in a surface-deviated shape to make the on-voltage to turn-off loss tradeoff optimized. While, a local peak of the electric field strength in the cathode region is reduced to make a local avalanche breakdown hardly occur, by which a sufficiently high breakdown voltage can be ensured. Thus, the on-voltage to breakdown voltage tradeoff can be prevented from being degraded. Moreover, with the cathode region isolated from the drift layer by the oxide film 21, the design dimension of the cathode region makes no direct contribution to the characteristics of the drift layer, so that the characteristics of the tradeoff are unchanged without further miniaturization of the source region than the miniaturization of the related device. Therefore, with a low cost manufacturing process being used, an IGBT can be obtained with a high rate of acceptable products, an excellent on-voltage to turn-off loss tradeoff and an excellent on-voltage to breakdown voltage tradeoff.

The present semiconductor device can have an IE effect greater than that of a related device, namely, a semiconductor device with an optimized on-voltage to turn-off loss tradeoff. Moreover, the present semiconductor device can prevent degrading the tradeoff between the on-voltage and the breakdown voltage by preventing a local electric field concentration when holding a voltage. Furthermore, the present semiconductor device having characteristics such as above with a high rate of acceptable products can be manufactured using a low cost manufacturing process for not so excessive miniaturization.

With the present semiconductor device, the carrier distribution in the drift layer made of the first conductivity type single crystal semiconductor substrate can be formed in a surface-deviated shape to optimize the on-voltage to turn-off loss tradeoff. A local peak of the electric field strength in the cathode region can be reduced to prevent a local avalanche breakdown, by which a sufficiently high breakdown voltage can be ensured. Moreover, the cathode region can be isolated from the drift layer (first conductivity type single crystal semiconductor substrate) by the first insulator film, so that the design dimension of the cathode region makes no direct contribution to the characteristics of the drift region. Therefore, the characteristics of the tradeoff can be unchanged without further miniaturizing the source region than that of the related device.

With the semiconductor device and the method of manufacturing the device according to the invention, an advantage is achieved in which, with a low cost manufacturing process being used, a semiconductor device such as an IGBT can be obtained with a high rate of acceptable products, an excellent on-voltage to turn-off loss tradeoff and an excellent on-voltage to breakdown voltage tradeoff.

As mentioned earlier, the semiconductor devices and the methods of manufacturing the devices according to the invention are useful for power semiconductor devices used for a system such as a power conversion system. In particular, the devices and the methods are suited for IGBTs.

In the foregoing, the present invention is not limited to the above-explained embodiments but can be variously modified. For example, the class of breakdown voltage of the IGBT, and the values such as those of the dimension, the concentration and the dose in each part are mere examples and thus can be varied.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Application Nos. 2005-020334, filed on 27 Jan. 2005, and 2004-256251, filed on 2 Sep. 2004. The disclosures of the priority applications, in their entirety, including the drawings, claims, and the specification thereof, are incorporated herein by reference.

What is claimed is:

1. A semiconductor device comprising:
   a single-crystal semiconductor substrate of a first conductivity type;
   a first insulator film selectively covering a first principal surface of the substrate, the first insulator film having an opening;
   a polycrystalline semiconductor region on the first insulator film;
   a second insulator film covering the polycrystalline semiconductor region;
   a first semiconductor region of the first conductivity type in contact with the substrate in the opening of the first insulator film;
   a second semiconductor region of the first conductivity type on the second insulator film outside the opening of the first insulator film;
   a third semiconductor region of a second conductivity type provided on the second insulator film between the first semiconductor region and the second semiconductor region;
   a first electrode in contact with both the second semiconductor region and the third semiconductor region;
   a third insulator film between the first electrode and the first semiconductor region;
   a fourth semiconductor region of the second conductivity type provided along a second principal surface of the substrate; and
   a second electrode in contact with the fourth semiconductor region.

2. The semiconductor device as claimed in claim 1, wherein the first semiconductor region has an impurity concentration higher than an impurity concentration of the substrate.

3. The semiconductor device as claimed in claim 1, wherein a fifth semiconductor region of the first conductivity type is provided between the single crystal semiconductor substrate and the fourth semiconductor region, the fifth semiconductor region having an impurity concentration higher than the impurity concentration of the substrate.

4. The semiconductor device as claimed in claim 1, wherein the first semiconductor region, the second semiconductor region, and the third semiconductor region are composed of a semiconductor film entirely made of polycrystalline silicon or at least partly made of single crystal silicon.

5. The semiconductor device as claimed in claim 1, further including a second conductivity type diffused layer independently provided in each cell, wherein the diffused layer is in a section of the substrate where the first semiconductor region is in contact with the substrate in the opening of the first insulator film.

6. The semiconductor device as claimed in claim 5, wherein the second conductivity type diffused layer becomes completely depleted when an applied voltage at forward voltage blocking is a voltage within a range of causing no avalanche breakdown in any part in the device.

7. The semiconductor device as claimed in claim 6, further including a first conductivity type diffused layer provided in a section of the second conductivity type diffused layer where the first semiconductor region is in contact with the second conductivity type diffused layer in the opening of the first insulator film.

8. The semiconductor device as claimed in claim 7, wherein the first conductivity type diffused layer becomes completely depleted when an applied voltage at forward voltage blocking is a voltage within a range of causing no avalanche breakdown in any part in the device.

9. The semiconductor device as claimed in claim 8, wherein the first conductivity type diffused layer extends to under the polycrystalline semiconductor region.

10. A semiconductor device comprising:
a single-crystal semiconductor substrate of a first conductivity type;
a first insulator film selectively buried under a first principal surface of the substrate;
a first semiconductor region of a second conductivity type between the first insulator film and the first principal surface;
a second semiconductor region of a first conductivity type in the first semiconductor region;
a second insulator film covering a region of the first principal surface other than where the first insulator film is buried;
a polycrystalline semiconductor region provided on the second insulator film;
a first electrode in contact with both the first semiconductor region and the second semiconductor region;
a third insulator film between the first electrode and the polycrystalline semiconductor region;
a third semiconductor region of the second conductivity type along a second principal surface of the substrate; and
a second electrode in contact with the second semiconductor region.

11. The semiconductor device as claimed in claim 10, further including fourth semiconductor region of the first conductivity type between the substrate and the third semiconductor region, the fourth semiconductor region having an impurity concentration higher than an impurity concentration of the substrate.

* * * * *